United States Patent
Hanzawa et al.

(10) Patent No.: US 7,116,593 B2
(45) Date of Patent: Oct. 3, 2006

(54) STORAGE DEVICE

(75) Inventors: Satoru Hanzawa, Hachioji (JP); Kiyoo Itoh, Higashikurume (JP); Hideyuki Matsuoka, Nishitokyo (JP); Motoyasu Terao, Hinode (JP); Takeshi Sakata, Hino (JP)

(73) Assignee: Hitachi, Ltd., Tokyo (JP)

( * ) Notice: Subject to any disclaimer, the term of this patent is extended or adjusted under 35 U.S.C. 154(b) by 143 days.

(21) Appl. No.: 10/485,566

(22) PCT Filed: Sep. 13, 2002

(86) PCT No.: PCT/JP02/09438

§ 371 (c)(1),
(2), (4) Date: Feb. 3, 2004

(87) PCT Pub. No.: WO03/065377

PCT Pub. Date: Aug. 7, 2003

(65) Prior Publication Data

US 2004/0184331 A1  Sep. 23, 2004

(30) Foreign Application Priority Data

Feb. 1, 2002 (JP) .............................. 2002-024919

(51) Int. Cl.
*G11C 7/00* (2006.01)
(52) U.S. Cl. ...................................... 365/203; 365/210
(58) Field of Classification Search ................ 365/203, 365/210, 205
See application file for complete search history.

(56) References Cited

U.S. PATENT DOCUMENTS 5,616,944 A * 4/1997 Mizutani et al. ............ 257/365
5,883,827 A   3/1999 Morgan
6,314,014 B1  11/2001 Lowrey et al.
6,359,805 B1 * 3/2002 Hidaka ....................... 365/171
6,603,678 B1 * 8/2003 Nickel et al. ................ 365/171
6,879,525 B1 * 4/2005 Van Brocklin et al. . 365/189.09

OTHER PUBLICATIONS

Stefan Lai et al., "OUM—A 180 nm Nonvolatile Memory Cell Element Technology for Stand Alone and Embedded Applications", IEEE International Electron Devices meeting (2001), Technical Papers, pp. 803-806.

Peter K. Naji et al., "A 256kb 3.0V 1T1MTJ Nonvolatile Magnetoresistive RAM", IEEE International Solid-State Circuits conference, Digest of Technical Papers (2001), pp. 122-123.

* cited by examiner

*Primary Examiner*—Michael Tran
(74) *Attorney, Agent, or Firm*—Reed Smith LLP; Stanley P. Fisher, Esq.; Juan Carlos A. Marquez, Esq.

(57) ABSTRACT

The object of the invention is to avoid an unselected data line being driven in a memory array composed of memory cells each of which uses a storage element depending upon variable resistance and a selection transistor when the selection transistors in all memory cells on a selected word line conduct. To achieve the object, a source line parallel to a data line is provided, a precharge circuit for equipotentially driving both and a circuit for selectively driving the source line are arranged. Owing to this configuration, a current path is created in only a cell selected by a row decoder and a column decoder and a read-out signal can be generated. Therefore, a lower-power, lower-noise and more highly integrated nonvolatile memory such as a phase change memory can be realized, compared with a conventional type.

12 Claims, 15 Drawing Sheets

STORAGE DEVICE

TECHNICAL FIELD

The present invention relates to a storage device including memory cells each of which includes an element in which difference is made in resistance corresponding to stored information, particularly relates to a storage device including a high-speed, highly-integrated and reliable phase change memory using a memory cell that stores information utilizing the change of a state of chalcogenide, detects resistance difference by the information and discriminates the information.

BACKGROUND ART

A list of documents referred in this specification is as follows. The documents shall be referred according to a document number. Document 1: IEEE International Solid-state Circuits Conference, DIGEST OF TECHNICAL PAPERS, pp. 122–123, 2001, Document 2: U.S. Pat. No. 5,883,827, Document 3: IEEE International Electron Devices meeting, TECHNICAL DIGEST, pp. 803–806, 2001, Document 3: U.S. Pat. No. 6,314,014

Document 1 discloses a sensitive sensing circuit of a magnetoresistive random access memory (MRAM). MRAM stores information utilizing magnetoresistive effect, however, sensitive reading (sensing) operation is demanded to discriminate a minute read-out signal component according to the magnetoresistive ratio of a few tens %.

Document 2 discloses a phase change memory to which stored information is written because a crystal state of a memory cell varies according to Joule heat by current flowing in the memory cell itself. As a recording layer is once melt at temperature exceeding 600° C. by Joule heat when it is turned amorphous, there is a problem that writing current is large, however, the phase change memory has a merit that a value of resistance varies by two digits or three digits according to a crystal state. Therefore, a reading signal is large and sensing operation is easy. Therefore, the phase change memory may realize a highly integrated and high-speed readable nonvolatile memory.

Document 3 discloses the matrix structure of a so-called phase change memory. In FIG. 2B, configuration that a memory cell located at an intersection of a predetermined word line and a predetermined column line (data line) is selected using the word line and plural QREADs selected by a column selection signal is disclosed.

FIG. 2 schematically shows the configuration of the phase change memory shown in FIG. 12 in the document 2. That is, the phase change memory is composed of a memory array, a row decoder XDEC, a column decoder YDEC, a reading circuit RC and a writing circuit WC. In the memory array, a memory cell MCpr is arranged at each intersection of a word line WLp (p=1, - - - , n) and a data line DLr (r=1, - - - , m). In each memory cell, a storage element RM and a selection transistor QM respectively connected in series are inserted between the data line DL and ground. The word line WL is connected to the gate of the selection transistor and a column selection line YSr (r=1, - - - , m) is connected to the corresponding column selection switch QAr.

According to such configuration, when the selection transistor on the word line selected by the row decoder XDEC conducts and further, the column selection switch corresponding to the column selection line selected by the column decoder YDEC conducts, a current path is created in a selected memory cell and a read-out signal is generated on a common data line I/O. As a value of resistance in the selected memory cell is different depending upon stored information, voltage output to the common data line I/O is different depending upon the stored information. Information stored in the selected memory cell is read by discriminating the difference in the reading circuit RC.

As a mobile equipment market recently develops, the demand of a non-volatile memory represented by a ferro-electric random access memory (FeRAM) and a flash memory increases. However, these memories have such problems in reliability, operational speed, power consumption and a degree of integration that a read/write frequency is limited. Therefore, for a high-speed and low-power non-volatile memory, the above-mentioned magnetoresistive random access memory (MRAM) utilizing magnetoresistive effect and the above-mentioned phase change memory attract attention.

These inventors discussed a signal sensing method of MRAM and the phase change memory prior to this application. As a result, they found that the following were not considered in the memory array configuration shown in FIG. 2. As selection transistors in all memory cells connected to a selected word line conduct during operation, a current path is also created in unselected cells in case the potential of an unselected data line is not ground potential. Therefore, multiple unselected data lines may be charged or discharged and power consumption may increase. Besides, an adjacent data line interferes with a read-out signal that emerges on the selected data line because of capacity coupling noise between data lines and stable read-out operation may be difficult. As an equivalent circuit in read-out operation in a memory cell of MRAM is the same as the phase change memory shown in FIG. 2, the above-mentioned problems are common in MRAM.

The object of the invention is to solve these problems. That is, the object of the invention is to avoid the problems caused by the conduction of transistors in all memory cells on a selected word line.

DISCLOSURE OF THE INVENTION

One of representative means according to the invention is as follows. That is, a control line (a source line) parallel to a data line is provided and the potential of the control line is variable. For example, if a precharge circuit for driving both the data line and the control line equipotentially and a circuit for driving a selected control line are arranged, a current path is generated in only a cell selected in a row and a column and a read-out signal can be generated.

BEST MODE FOR CARRYING OUT THE INVENTION

FIRST EMBODIMENT

Figure 1:
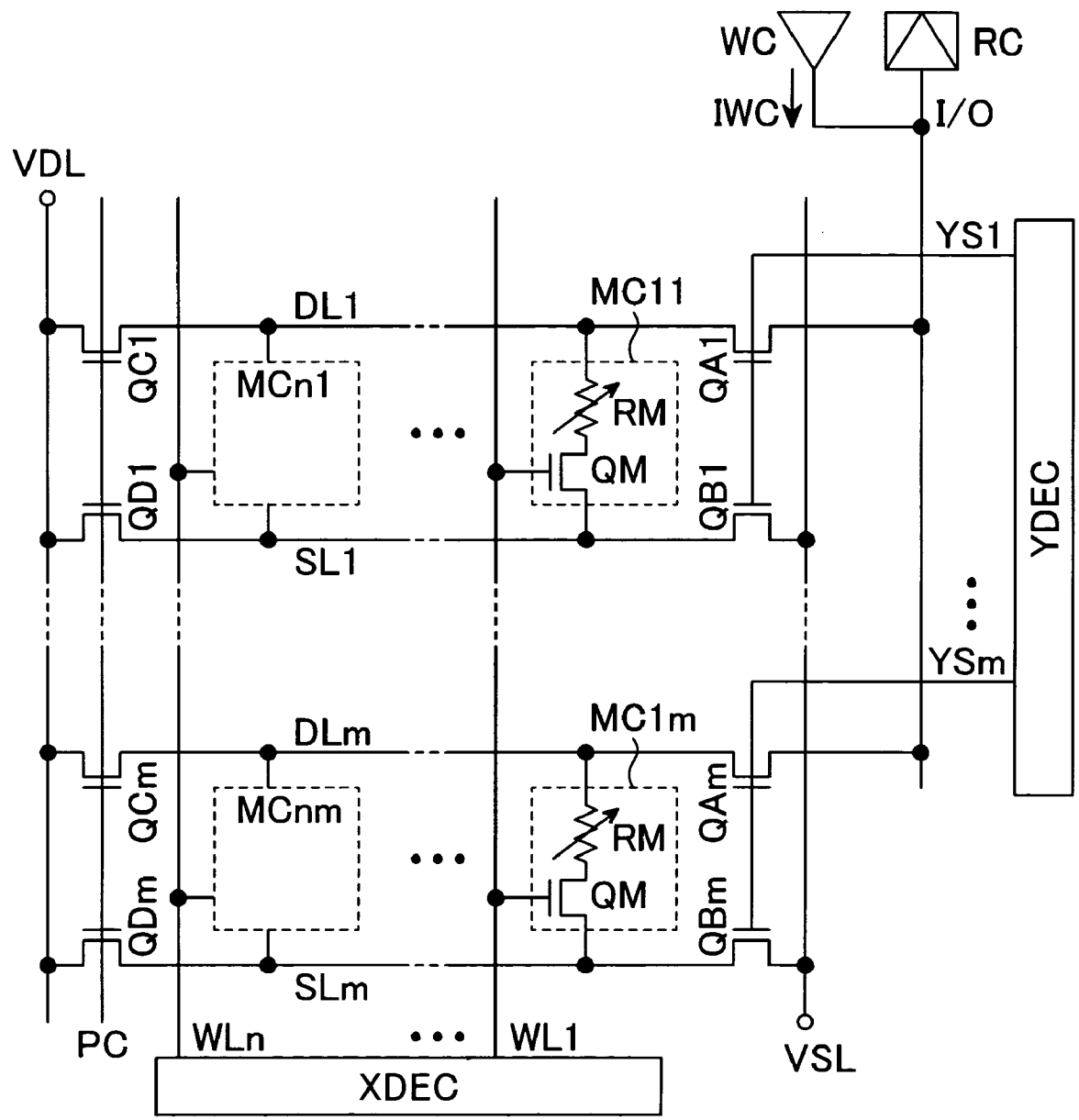
FIG. 1 shows an example of the configuration of a memory array using a memory cell composed of one storage element the resistance of which varies according to stored information and one selection transistor according to the invention.

Referring to the drawings, embodiments of the invention will be described in detail below. A circuit element forming each block in the embodiments is not particularly limited, however, it is typically formed on one semiconductor substrate made of single crystal silicon and others by semiconductor integrated circuit (including a well-known complementary MOS (CMOS) transistor) technology. Further, chalcogenide for a change of a phase and others are produced as a hybrid by technique for producing an integrated circuit.

<<Memory Array Configuration>>

FIG. 1 shows an example of the configuration of a memory array according to the invention. In FIG. 1, a row decoder XDEC, a column decoder YDEC, a reading circuit RC and a writing circuit WC respectively required for the operation of the memory array are also simultaneously shown. This configuration is characterized in that a current path is created in only a selected cell located at an intersection of a selected word line and a selected source line by providing a source line parallel to a data line and arranging a precharge circuit for driving both equipotentially and a circuit for selectively driving the selected source line.

Figure 2:
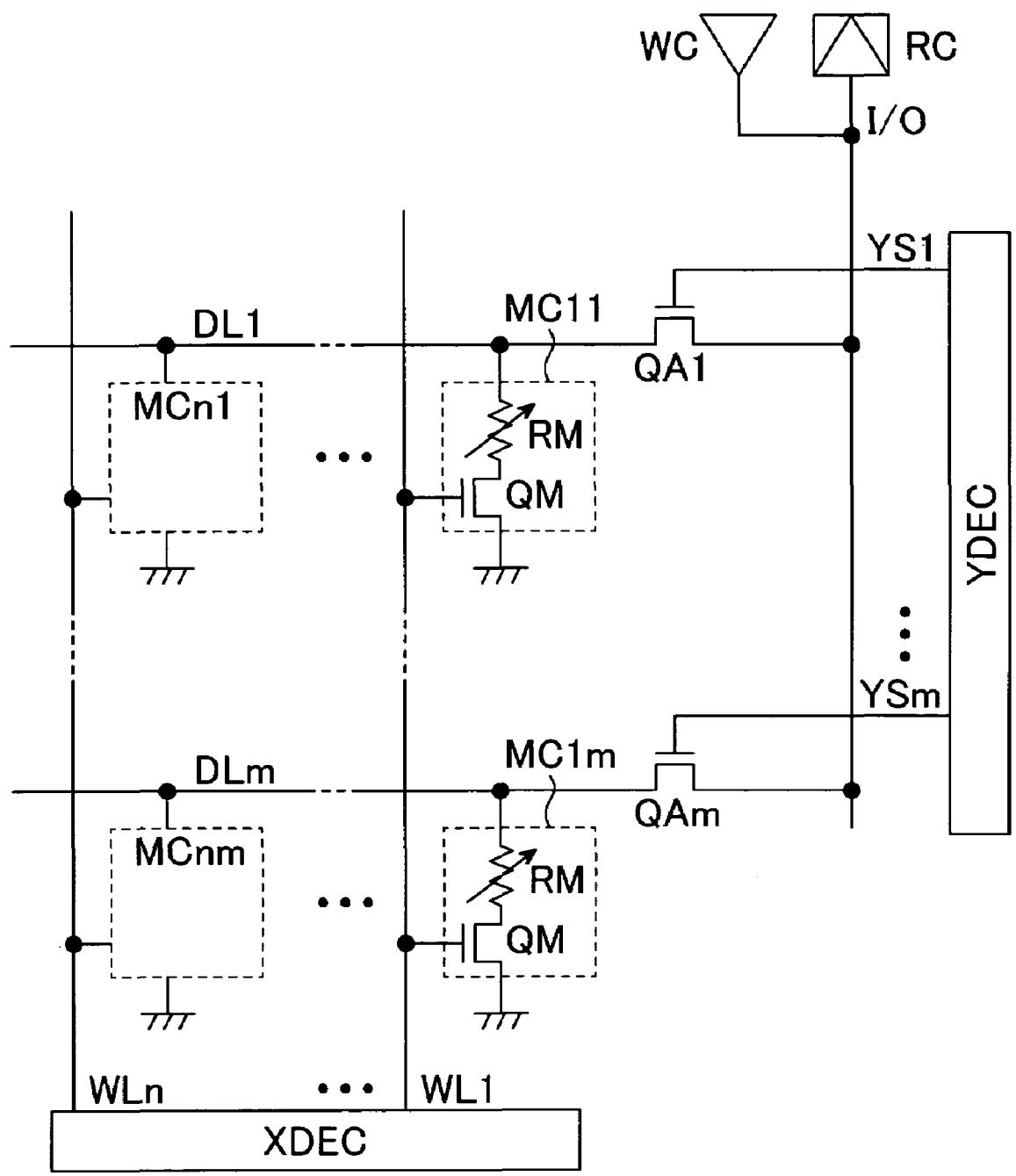
FIG. 2 shows an example of the configuration of a conventional type memory array using a memory cell composed of one storage element the resistance of which varies according to stored information and one selection transistor.

The memory array, has the configuration provided with memory cells of (n×m) bits as also shown in FIG. 2. For an element forming the memory cell, a selection transistor QM and a storage element RM depending upon variable resistance by chalcogenide are included as in the conventional example shown in FIG. 4.

The row decoder XDEC selects a word line WL according to a row address. The column decoder YDEC drives a column selection line YS according to a column address. When a column selection switch QA according to the selected column selection line YS conducts, the selected memory cell is connected to the reading circuit RC or the writing circuit WC via a common data line I/O. QA1 to QAm can be regarded as forming a first switching circuit for selecting one of plural data lines (DL1 to DLm) and connecting it to the common data line. QB1 to QBm can be regarded as forming a second switching circuit for selecting one of plural source lines (DS1 to DLm) and connecting it to a source voltage supply line.

This memory array configuration has the following three characteristics. The first characteristic is that plural (m pieces in this case) source lines SLr (r=1, - - - , m) parallel to the data line DL are arranged and the sources of the transistors QM in a direction of a row are connected to the source line SL in common. The second characteristic is that each of plural (m pieces in this case) NMOS transistors QBr (r=1, - - - , m) is inserted between each source line SLr and a source voltage terminal VSL and these transistors are selected by the column decoder. In FIG. 1, an example that the column selection line YSr corresponding, to each gate of these is directly connected is shown. The third characteristic is that plural (m pieces in this case) NMOS transistors QCr and QDr (r=1, - - - , m) are for driving the corresponding data line DL and source line SL at precharge voltage VDL are arranged and a precharge enable signal line PC is connected to each gate of these transistors. According to such configuration, the source line corresponding to the data line to be selected out of the plural data lines DL and source lines SL respectively driven at precharge voltage VPC can be driven. That is, voltage difference can be applied to only the memory cell connected to the data line to be selected and its source line. Therefore, a current path is created in only a desired memory cell on a selected word line and a reading signal can be applied to only a selected data line.

The precharge circuit can be interpreted as the whole of QC1, QD1 to QCm and QDm, and QC1 and QD1 can be regarded as an element precharge circuit provided for every pair of DL1 and SL1.

<<Characteristics of Storage Element>>

Figure 3:
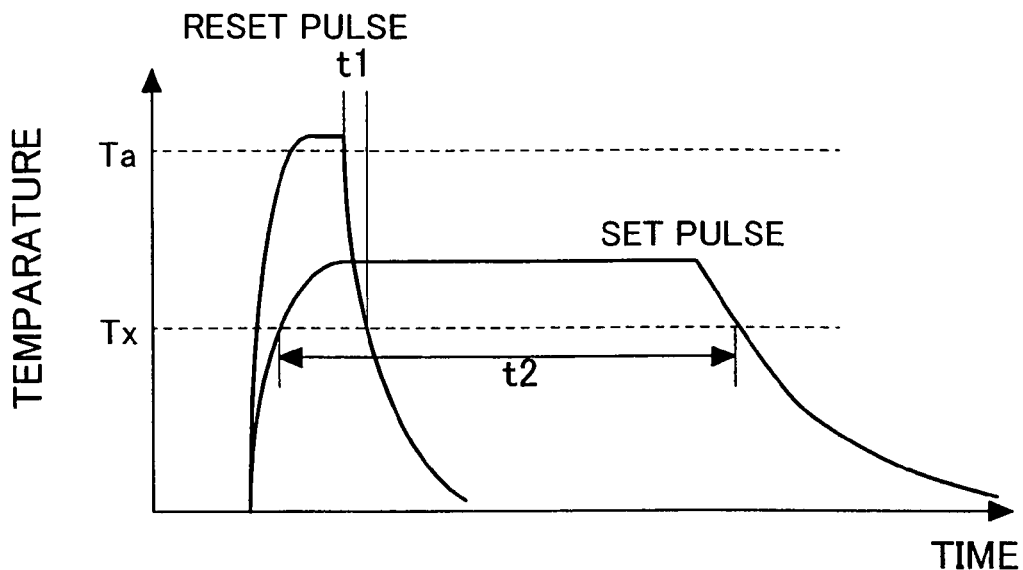
FIG. 3 shows Relation between pulse width required for the phase change of the storage element and temperature.
Figure 4:
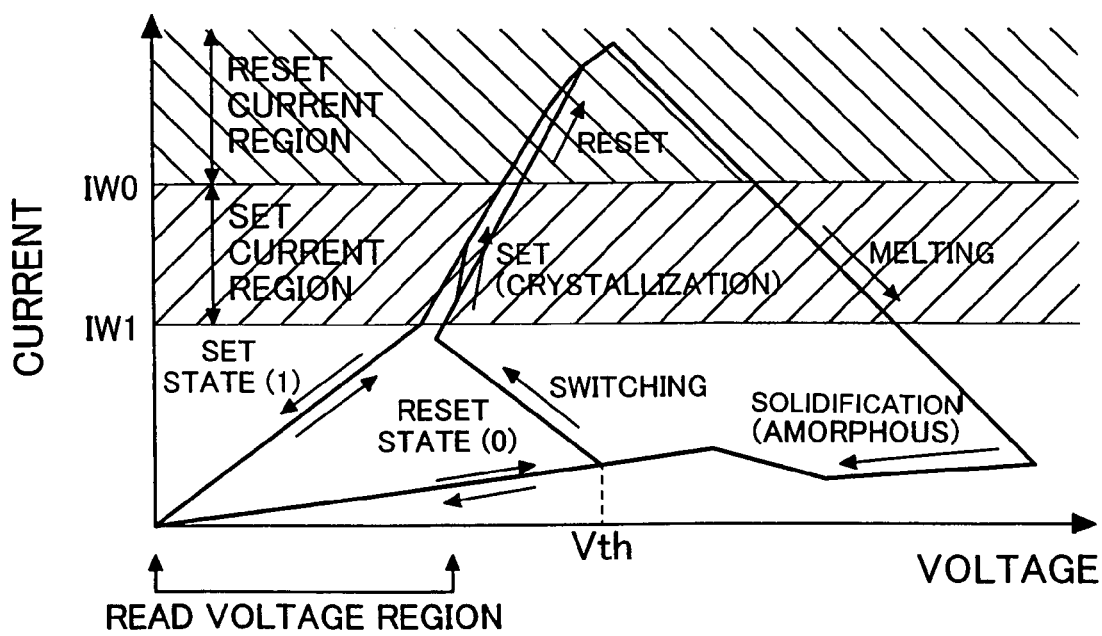
FIG. 4 shows the current-voltage characteristic of the storage element.

Chalcogenide such as Ge-Sb-Te and Ag-In-Sb-Te respectively at least including antimony (Sb) and tellurium (Te) is used for the material of a recording layer of a storage element. The characteristics of a phase change memory using chalcogenide are described in the document 3 for example. In case stored information '0' is written to the storage element, such a reset pulse as quenches after heating the element at a melting point Ta of chalcogenide or higher as shown in FIG. 3 is applied. Chalcogenide is turned into a high-resistance amorphous state by shortening the reset pulse to reduce the given energy and setting cooling time t1 to a short time, approximately 1 ns for example. Conversely, in case stored information '1' is written, chalcogenide is turned a low-resistance polycrystalline state by applying such a set pulse that keeps the storage element in a temperature region lower than the melting point and higher than crystallizing temperature Tx equal to or higher than a glass transition point. Time t2 required for crystallization is different depending upon the composition of chalcogenide, however, it is approximately 50 ns for example. The temperature of the element shown in FIG. 3 depends upon Joule heat emitted by the storage element itself and thermal diffusion to surroundings. Therefore, the crystal state of the storage element is controlled by applying a current pulse of a value according to written information to the storage element as shown in an I–V characteristic in FIG. 4. FIG. 4 schematically shows the operating principle of the storage element using chalcogenide and shows that in case set current in a range from IW1 to IW0 is applied, stored information '1' is written and in case reset current equal to or exceeding IW0 is applied, stored information '0' is written. However, a case in which '0' and '1' are reverse is also allowed. Referring to FIG. 4, four types of writing operation will be described in detail below.

First, when set current is applied in case '1' is written to the storage element the initial state of which is '1', the state is held because the current changes between the initial state and a set region drawing a low-resistance curve in the set (crystal) state. Secondly, when reset current is applied in case '0.' is written to the storage element the initial state of which is '1', the current reaches reset current drawing the low-resistance curve in the set state. Next, as melting partially starts by Joule heat, the conductivity gradually lowers. Further, when melting proceeds, the storage element is turned a high-resistance state. As the storage element in a liquid phase is turned an amorphous state when it is quenched, it returns to the initial state drawing a high-resistance curve in a reset (amorphous) state slightly lower than the resistance in the liquid phase. Thirdly, when set current is applied in case '1' is written to the storage element the initial state of which is '0', the state is switched to the low-resistance state when the terminal voltage of the storage element exceeds threshold voltage Vth. After switching, crystallization proceeds by Joule heat. As a crystallized region expands, a phase change occurs and further, a value of its resistance lowers when its current value reaches set current, the state returns to the initial state drawing the low-resistance curve. The reason why the inclination of a voltage-current curve becomes gentle on the way is that a region switched to the low-resistance state is switched to an OFF state and only the low-resistance state by crystallization remains. Fourthly, in case '0' is written to the storage element the initial state of which is '0', there is hardly time for crystallization after the switching, the current reaches a reset region drawing the low-resistance curve by switching., melting, quenching and solidification occur and the state returns to the initial state.

Operation based upon such principle for operating the storage element, inhibiting at voltage lower than the threshold voltage Vth at the highest to prevent stored information from being destroyed in reading is required. Actually, as the threshold voltage depends upon voltage application time and tends to lower in long time, the storage element is required to be kept at such voltage that the state is not switched to the low-resistance state exceeding the threshold voltage in reading time. Then, operation based upon the principle for realizing the configuration of the memory array shown in FIG. 1 will be described below.

<<Reading Operation>>

Figure 5:
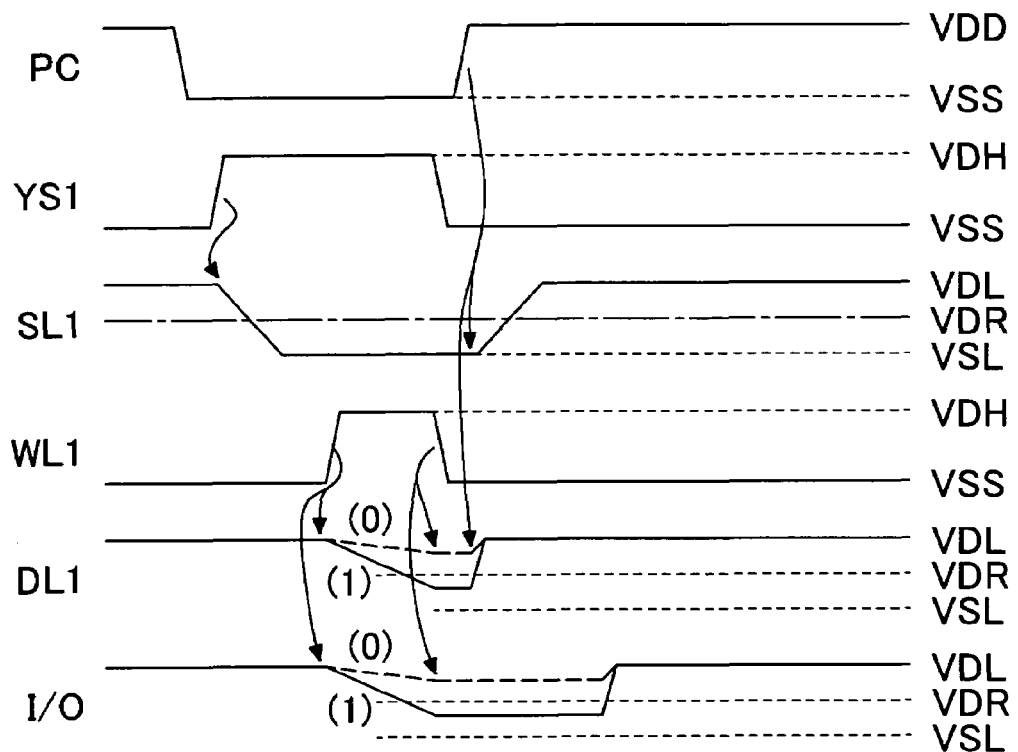
FIG. 5 shows the read-out operation timing of the memory array according to the invention.

Next, referring to FIG. 5, the reading operation of the memory cell using the array configuration shown in FIG. 1 will be described. FIG. 5 shows an operational waveform in case a memory cell MC11 is selected.

First, as a precharge enable signal PC is held at power supply voltage VDD (for example, 1.5 V) in a stand-by state, the data line DL and the source line SL are kept at precharge voltage VDL by the NMOS transistors QC and QD. VDL is a value lower than VDD by the threshold voltage of the transistor and is 1.0 V for example. The common data line I/O is also precharged at the precharge voltage VDL by the reading circuit RC.

As the precharge enable signal PC kept at the power supply voltage VDD is driven at ground potential VSS and the column selection line YS1 kept at ground potential VSS is driven at step-up potential VDH (for example, 1.5 V or more) when reading operation is started, the transistors QA1 and QB1 conduct. At this time, as the data line DL1 is at equal potential to the common data line I/O, it is kept at precharge voltage VDL, however, the source line SL1 is driven at source voltage VSL (for example, 0.5 V) by the transistor QB1. Concerning the source voltage VS1 and the precharge voltage VDL, the precharge voltage VDL is higher than the source voltage VSL and the difference is set so that the terminal voltage of the resistor RM is in the range shown in FIG. 4 of a reading voltage region. Next, when the word line WL1 kept at ground potential VSS is driven at step-up potential VDH, the transistors QM in all memory cells on the word line WL1 conduct. At this time, a current path is created in the memory cell MC11 in which potential difference is made in the storage element RM, and the data line DL1 and the common data line I/O are discharged toward source voltage VSL at speed according to a value of the resistance of the storage element RM. As a value of resistance is smaller in case stored information '1' is kept, compared with the case of stored information '0' in FIG. 5, discharge is fast. Therefore, signal voltage according to stored information is generated. As the potential difference of each storage element RM is 0 in unselected memory cells MC12 to MC1m, unselected data lines DL12 to DL1m are kept at precharge voltage VDL. That is, read current flows from only the memory cell MC11 selected by the word line WL1 and the source line SL1 via the data line DL1. After read information is discriminated in the reading circuit RC, the voltage of the word line WL1 can be lowered. When the voltage of the word line WL1 continues to be lowered in case the discrimination is slow, the selected data line DL1 is also discharged up to the vicinity of source voltage VSL in case stored information '0' is read, difference between signal voltage in case '0' is read and signal voltage in case '1' is read decreases and it may be impossible to read the stored information correctly. In such a case, malfunction can be prevented by lowering the voltage of the word line WL1 at timing before the voltage of the data line in case '0' is read exceeds reference voltage VDR as shown in FIG. 5. As signal voltage on the common data line I/O is held by lowering the voltage of the word line and cutting off the current path, the reading circuit RC can discriminate a positive or negative signal generated based upon reference voltage VDR. When the above-mentioned reading operation is finished, the common data line I/O is driven at precharge potential VDL and returns to a stand-by state.

When the data line and the source line of the memory array are floating in a stand-by state, the capacity of the data line the voltage of which is indeterminate is charged from the common data line when the data line and the common data line are connected in starting reading operation. Therefore, in FIG. 5, the data line and the source line are driven at precharge potential VDL in a stand-by state by also lowering the voltage of the column selection line YS1 according to the word line WL1 and further, driving the precharge enable signal PC kept at ground potential VSS at power supply voltage VDD. The step-up potential VDH is voltage widely used in conventional type DRAM and is set so that the relation of "VDH>VDD+VTN" is met using the power supply voltage VDD and the threshold voltage VTN of the NMOS transistor. For example, in the writing operation of the phase change memory, as described later, larger current than current in reading operation is required. Therefore, in the invention, precise writing operation is enabled by driving the word line WL and the column selection line YS at step-up potential VDH and lowering the resistance of the NMOS transistor. Current flows from the selected source line to the source of the transistor QM in the selected memory cell and the voltage between the gate and the source of the transistor can be secured without depending upon the resistance of the storage element RM by setting the precharge voltage VDL to a value higher than the source voltage VSL. Also in reverse potential relation, if only the difference is set so that it is in the range of the reading voltage region shown in FIG. 3, the similar selection is possible.

FIG. 5 shows the case that the word line WL1 is driven after the source line SL1 is driven, however, according to the convenience of design, the source line SL1 may be also driven after the word line WL1 is driven. In this case, as first, the word line WL1 is driven and the selection transistor QM conducts, the terminal voltage of the storage element RM is secured at 0 V. Afterward when the source line SL1 is driven, the terminal voltage of the storage element RM increases from 0 V, however, the value can be controlled at the driving speed of the source line SL1 and can be kept in the above-mentioned range of the reading region. Similarly, the word line WL1 and the source line SL1 can be also driven substantially at the same time. As time waiting for output to I/O can be reduced if the column selection line YS1 is driven prior to a pulse of the slower in driving timing out of the word line WL1 and the source line SL1, access time is reduced. Naturally in this case, wiring has only to be changed so that the transistors QA1 and QB1 shown in FIG. 1 can be independently driven.

The case that the memory cell MC11 is selected is described above, however, memory cells on the same data line are never selected because word line voltage is fixed to ground potential VSS. As another data line and its source line are at the same potential VDL, the residual memory cells are also kept a state of an unselected cell. It is clear that the above-mentioned reading operation can be applied to any memory cell operation in common in case resistance difference in a memory cell is detected. Therefore, in the case of MRAM, the above-mentioned reading operation also produces effectiveness.

In the above description, the word line in a stand-by state is at ground potential VSS and the selected source line is at the positive source voltage VSL of 0.5 V. The relation in voltage is set so that current flowing in an unselected memory cell is prevented from having an effect upon the operation. That is, transistors QM of unselected memory cells MC21 to MCn1 when the source line is selected and the word line selects an unselected memory cell, for example, the memory cell MC11 have only to be set so that they are sufficiently off. The threshold voltage of the transistor QM can be lowered by keeping the voltage of a word line in a stand-by state at ground potential VSS and keeping source voltage VSL positive as described above. A selected source line can be also kept at ground potential 0 V and a word line in a stand-by state can be also kept at negative voltage. In that case, the threshold voltage of the transistor QM can be also lowered. Though negative voltage is required to be generated for the stand-by word line, the voltage of the selected source line is easily stabilized because the voltage is at ground potential VSS applied from the outside. In case the threshold voltage of the transistor QM is sufficiently high, the selected source line and the stand-by word line may be also at ground potential 0 V. In that case, as the ground potential VSS is applied from the outside and in addition, the capacity of the stand-by-word line functions as stabilizing capacity, the voltage of the selected source line can be made further stable.

Further, operation for discriminating signal voltage read to the common data line I/O in the reading circuit RC is described above, however, operation for discriminating current flowing on the common data line I/O is also possible. In that case, a sensing circuit the input impedance of which is small and which is described in the document 1 for example is used for the reading circuit RC. The effect of the wire capacity of the common data line is reduced by adopting such a method of sensing current and reading time can be reduced.

<<Writing Operation>>

Figure 6:
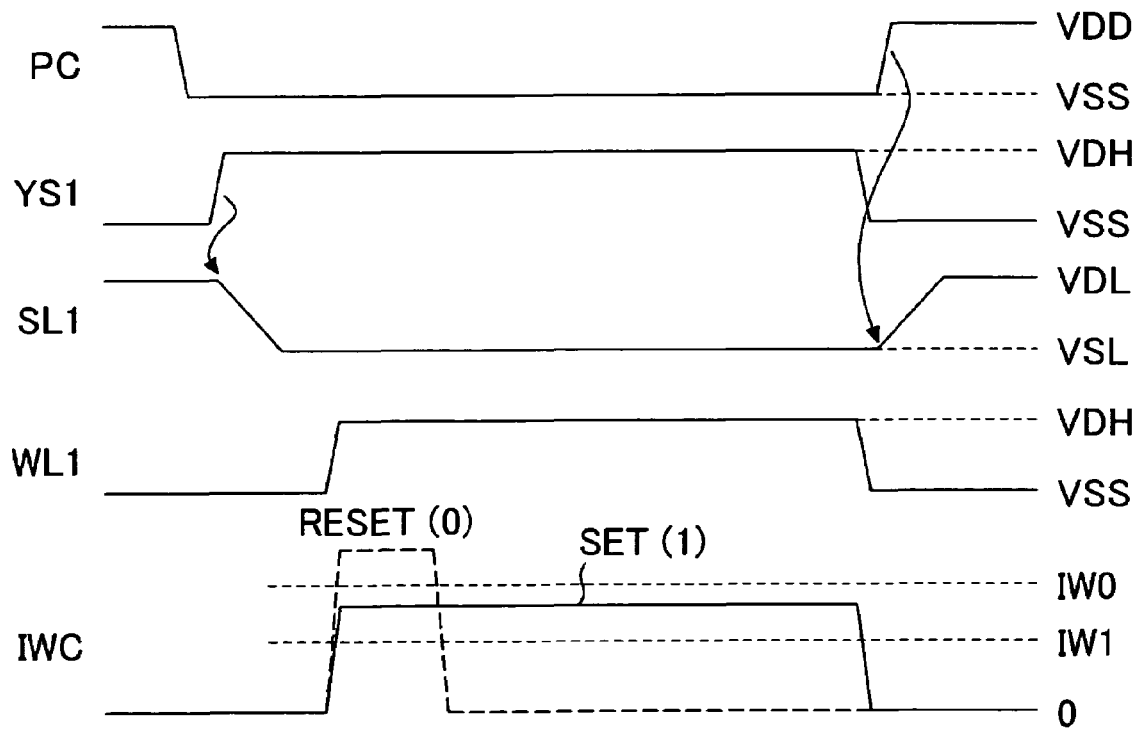
FIG. 6 shows the writing operation timing of the memory array according to the invention.

Further, referring to FIG. 6, the writing operation of the memory cell using the array configuration shown in FIG. 1 will be described. However, FIG. 6 shows an operational waveform in case the memory cell MC11 is selected.

First, operation for selecting the memory cell MC11 is executed as in reading operation. As the writing circuit WC drives the common data line I/O when the memory cell MC11 is selected, writing current IWC is generated. In case '0' is written, reset current set to a value in the range shown in FIG. 4 is applied to the memory cell MC11. The pulse width of the reset current is short, the memory cell returns to a stand-by state immediately after driving and its current value becomes 0. Joule heat is generated by such reset current as in the case of the reset pulse shown in FIG. 3. Conversely, in case '1' is written, set current set to a value in the range shown in FIG. 4 is applied. The pulse width is approximately 50 ns. Joule heat is generated by such set current as in the case of the set pulse shown in FIG. 3. As the application time and the current value of a writing pulse are controlled in the writing circuit WC as described above, the memory cell is selected in only the pulse width of set current even if either stored information is written.

<<Memory Cell Structure>>

Next, an example of the structure of the memory array will be described. This structure is characterized in that an active region of a MOS transistor is inclined with a word line, a data line and a source line. Memory cell structure in which the source line is wired on a first metal layer, the data line is wired on a second metal layer and the source line is provided corresponding to the data line is realized.

Figure 7:
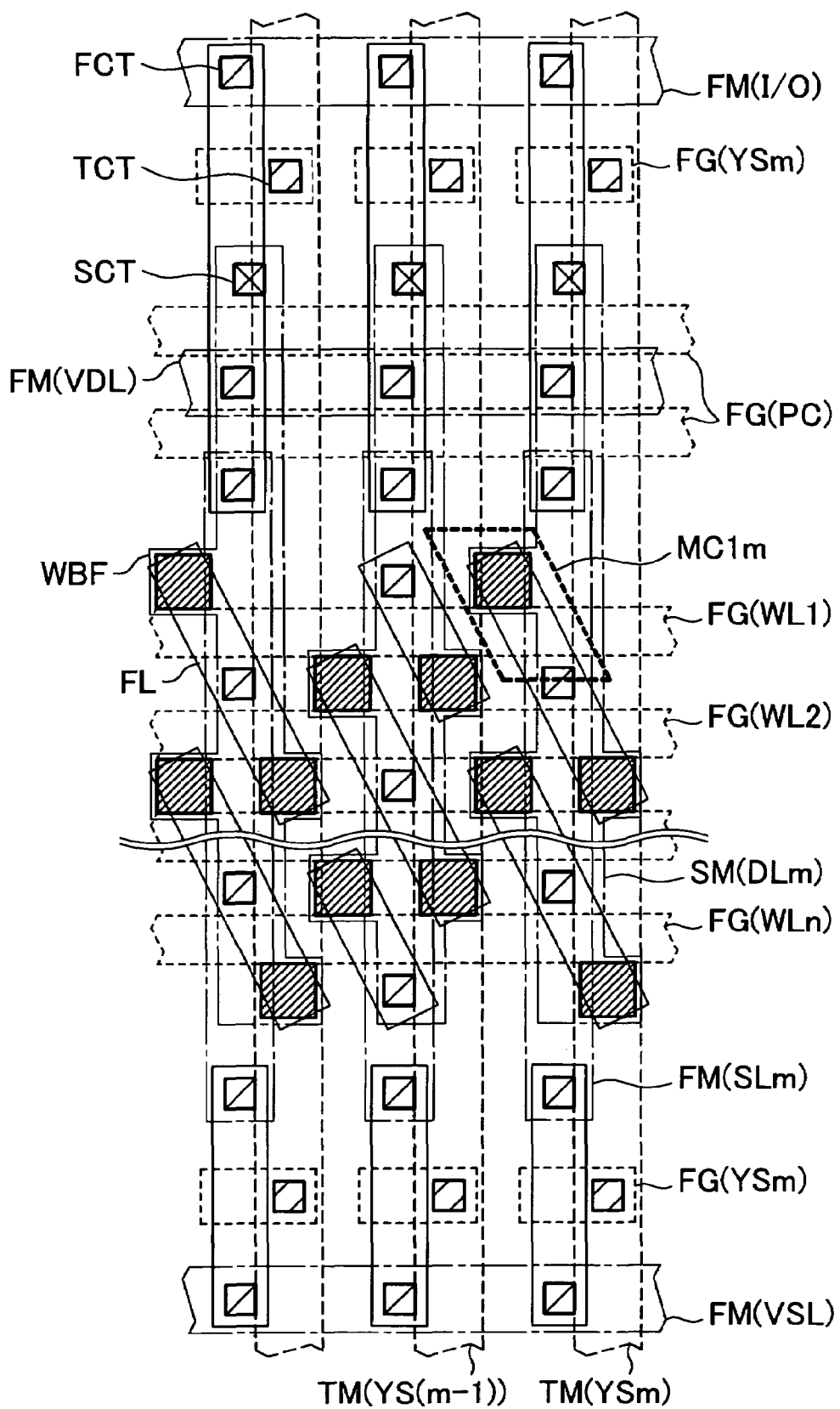
FIG. 7 shows the layout of the memory array according to the invention.

FIG. 7 shows the layout. In FIG. 7, FL denotes an active region pattern, FM denotes a first metal layer pattern including the source line SL and a power supply line, SM denotes a second metal layer pattern for the data line DL, TM denotes a third metal layer pattern for a column selection line YS, FG denotes a first gate electrode pattern of a transistor formed on a silicon substrate, FCT denotes a first metal layer contact pattern, SCT denotes a second metal layer contact pattern, TCT denotes a third metal layer contact pattern and WBF denotes a lower electrode layer of a storage element. Well-known optical lithography can be used for the patterning of these patterns. In FIG. 7, a storage element is formed on each lower electrode layer WBF. As the corresponding node name is shown in parentheses after a pattern name, it can be easily understood that for example, a memory cell MC1m is arranged in a position shown at an intersection of a word line WL1, a data line DLm and a source line SLm.

Figure 8:
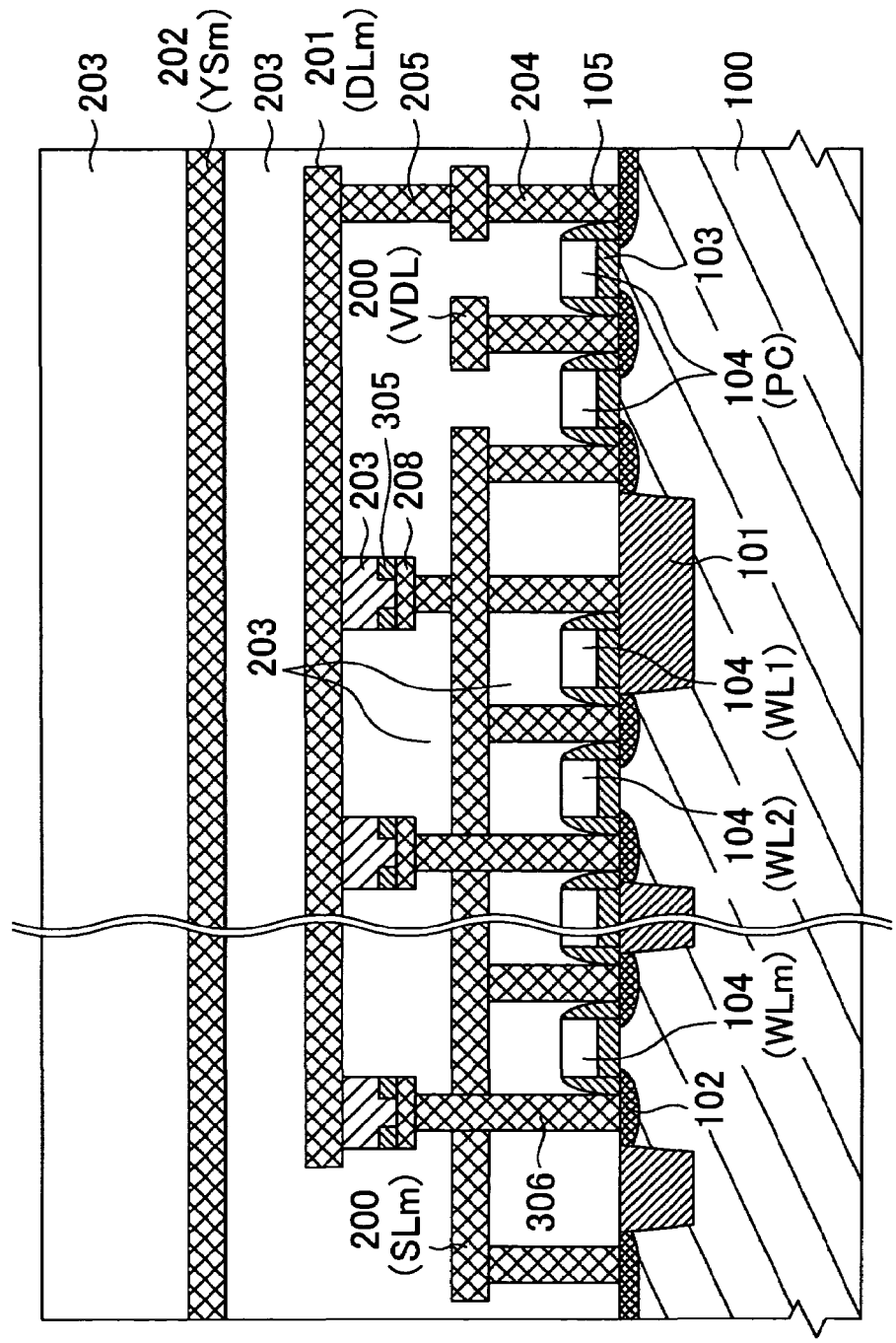
FIG. 8 is a sectional view schematically showing the structure of the memory array shown in the layout in FIG. 7.

FIG. 8 schematically shows the section viewed from a direction perpendicular to the data line of the memory array. A reference number 100 denotes a P-type semiconductor substrate, 101 denotes an insulator for element isolation buried in the P-type semiconductor substrate, 102 denotes an N-type diffused layer region in the active region pattern FL shown in FIG. 7, 103 denotes a gate oxide film of a transistor formed on the substrate, 104 denotes a gate electrode of the transistor formed on the substrate, and 105 denotes a side wall formed by an insulating film on the transistor formed on the substrate. A reference number 200 denotes the first metal layer used for the source line SL and the power supply line. A reference number 201 denotes the second metal layer used for the data line DL and others, 202 denotes the third metal layer used for the column selection line YS, 203 denotes an interlayer insulation film, 204 denotes a contact for connecting the N-type diffused layer region 102 and the first metal layer, and 205 denotes a contact for connecting the first metal layer and the second metal layer. Further, a reference number 208 denotes a tungsten layer that functions as a lower electrode of the storage element RM, 304 denotes chalcogenide to be the storage element RM, 305 denotes an insulating film, and 306 denotes a contact for connecting the lower electrode 208 and the N-type diffused layer region 102. In FIG. 8, a node name is shown in parentheses after a layer name on the supposition that the data line DLm and the source SLm are viewed from the end of the array. For example, the arrangement of a selection transistor and transistors QCm, QDm for precharge can be easily understood by a node name of the gate electrode shown as 104 in FIG. 8.

The metal layers, the contacts and the lower electrode layer 208 are formed by tungsten the melting point of which is high for example to prevent the deterioration by heat treatment when an upper part is formed of electric characteristics and the chemical reaction and the mutual diffusion of chalcogenide and the electrode in rewriting multiple times. The contacts are buried in clearance between the side walls 107. The processing technique is called a self-aligning process widely used in conventional type DRAM.

Concerning the storage element in this embodiment, as area in which the chalcogenide 304 and the lower electrode 208 are in contact is reduced using the insulating film 305 shown in FIG. 8, a value of resistance is large. Therefore, as high Joule heat can be generated with small current, a phase change memory in which low-power writing operation is enabled can be realized. As the word line can be arranged at 2F (F: minimum feature size) of the minimum pitch and the data line can be arranged at 3F pitch equivalent to 1.5 times of the word line owing to the layout shown in FIG. 7, the phase change memory having the size of 6 times of the square of F can be realized.

EFFECT OF THIS EMBODIMENT

Effect by the configuration and the operation of the memory array and the memory cell respectively described above is as follows. First, in the memory array equivalent to this embodiment, power consumption in reading operation can be reduced by providing the source line SL parallel to the data line DL and connecting the source of the selection transistor QM in the memory cell to the corresponding source line SL respectively as shown in FIG. 1. Concretely, the selection transistors QA, QB are arranged on the data line DL and on the source line SL and further, the transistors QC, QD for precharge are arranged. In such configuration, the source line corresponding to the selected data line can be driven at source voltage VSL. Therefore, a current path is created in only the cell at the intersection of the selected word line and the selected source line and a read-out signal can be generated on only the selected data line. Therefore, power consumption in the reading operation of the phase change memory and MRAM for example can be reducing by inhibiting the charge and the discharge of an unselected data line. In case the invention is applied to a phase change memory, the low-power phase change memory as a whole can be realized because the similar selection to that in reading operation is also performed in writing operation.

Secondly, as the potential of an unselected data line is kept by the selection described in the first effect in the memory array equivalent to this embodiment, noise by capacity coupling between the data lines is small and a stable read-out signal can be generated. Therefore, the phase change memory the reading operation of which is stable can be realized.

<<Memory Cell Structure Using Vertical Transistor>>

Next, another example of the memory array structure will be described. The structure is characterized in that a MOS transistor having vertical structure is used for the selection transistor QM in a subarray shown in FIG. 1.

Figure 9:
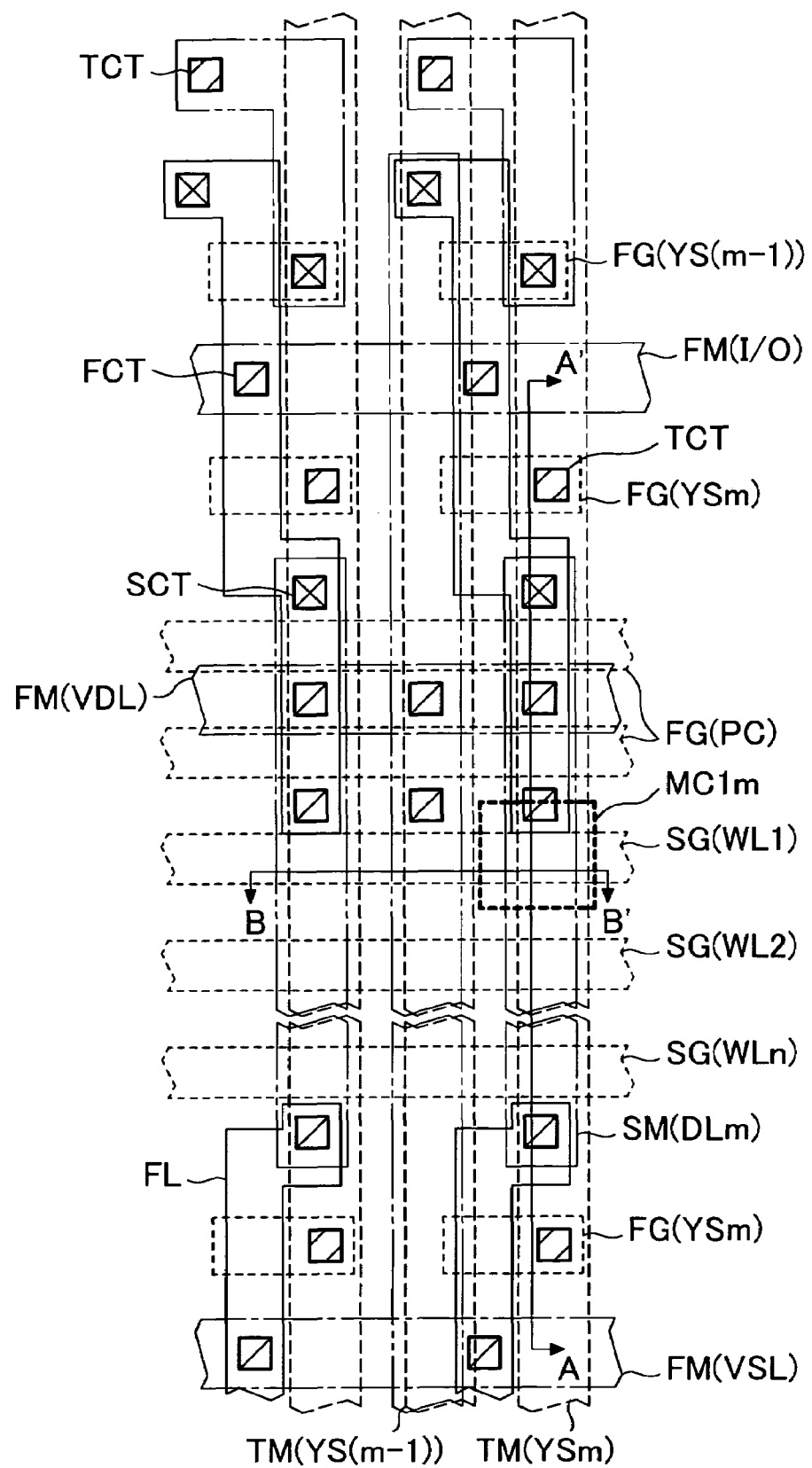
FIG. 9 shows another layout of the memory array according to the invention.

FIG. 9 shows its layout. As in FIG. 7, FL denotes an active region pattern, FM denotes a first metal layer pattern including a source line SL and others, SM denotes a second metal layer pattern for a data line DL, TM denotes a third metal layer pattern for a column selection line YS, FG denotes a first gate electrode pattern of a transistor formed on a silicon substrate, SG denotes a second gate electrode pattern of a word line WL, that is, a vertical transistor, FCT denotes a first metal layer contact pattern, SCT denotes a second metal layer contact pattern, and TCT denotes a third metal layer contact pattern. The vertical transistor and chalcogenide are laminated in a region in which the second gate electrode pattern SG and the second metal layer pattern SM are crossed and a memory cell is formed. For the patterning of these patterns, well-known optical lithography can be used. In FIG. 9, the corresponding node name is shown in parentheses after a pattern name on the supposition that a line A–A' is located on a data line DLm and a line B–B' is located on a data line WL1. For example, it can be easily understood that a memory cell MC1m is arranged in a position shown by an intersection of the word line WL1 and the data line DLm.

Figure 10:
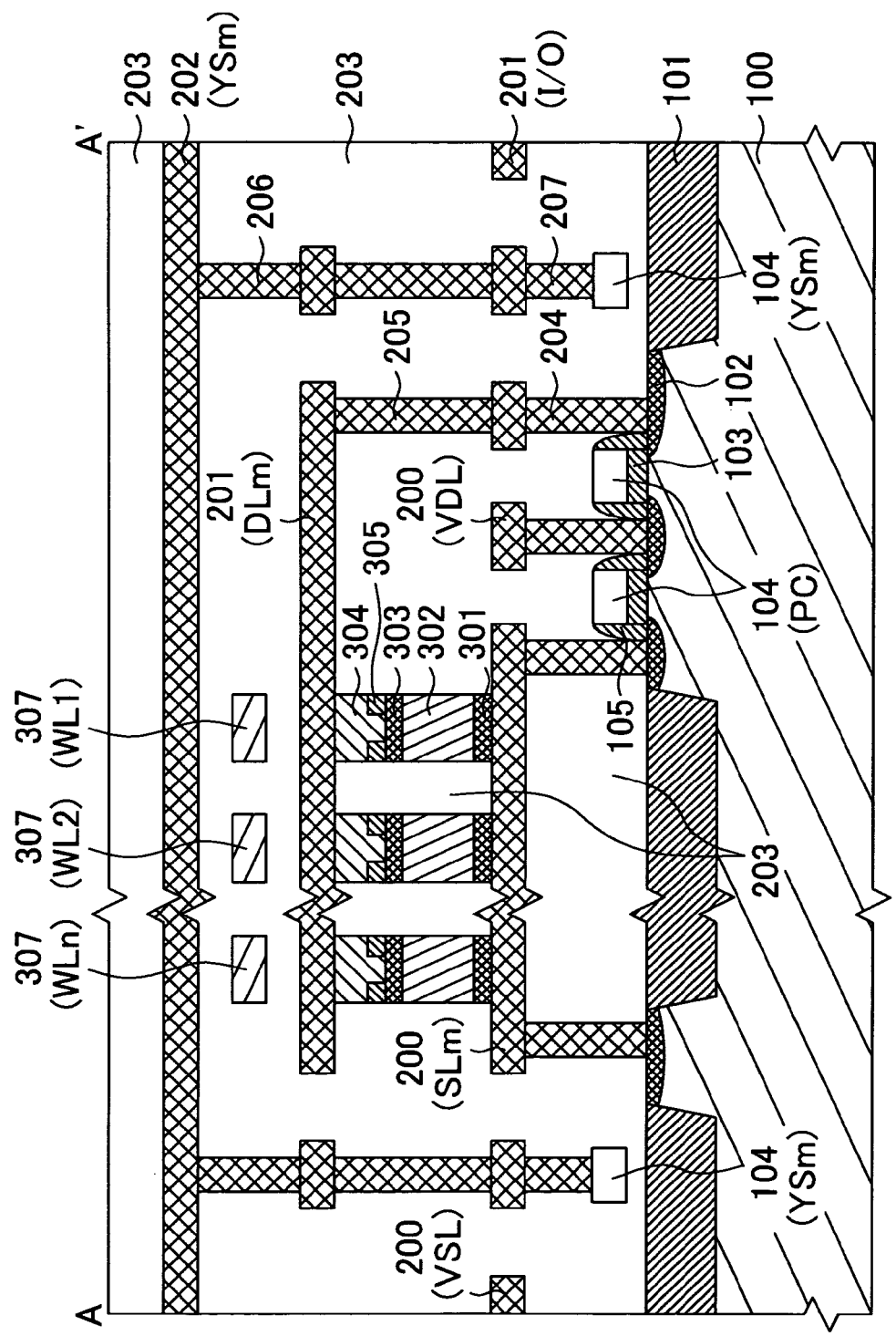
FIG. 10 is a sectional view showing the structure of a part viewed along a line A–A' shown in the layout in FIG. 9.
Figure 11:
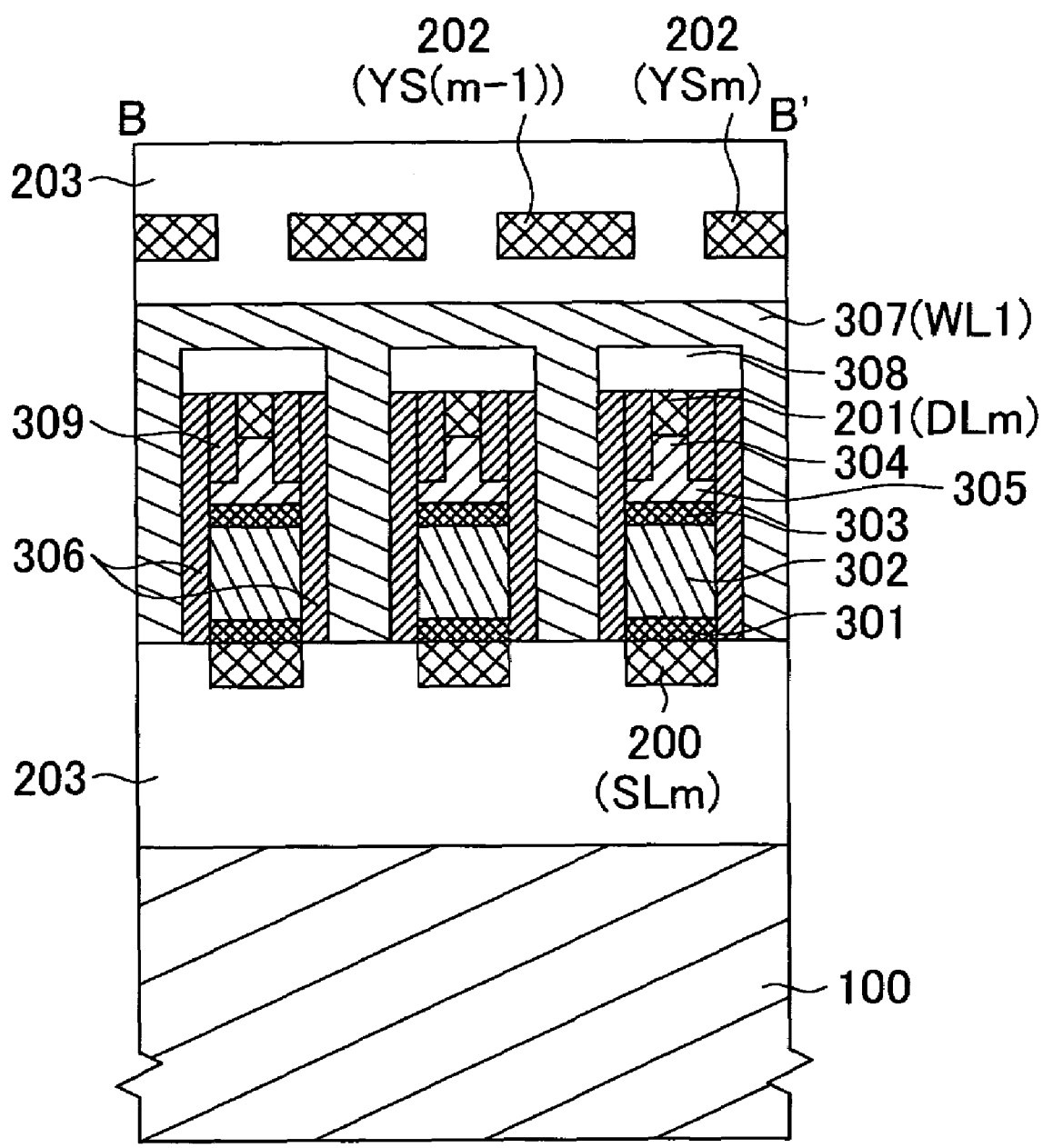
FIG. 11 is a sectional view showing the structure of a part viewed along a line B–B' shown in the layout in FIG. 9.

FIG. 10 shows the section of a part viewed along the line A–A' shown in FIG. 9. Similarly, FIG. 11 shows the section of a part viewed along the line B–B' shown in FIG. 9. In these drawings, a reference number 100 denotes a P-type semiconductor substrate, 101 denotes an insulator for element isolation buried in the P-type semiconductor substrate, 102 denotes an N-type diffused layer region in the active region pattern FL shown in FIG. 9, 103 denotes a gate oxide film of a transistor formed on the substrate, 104 denotes a gate electrode of the transistor formed on the substrate, and 105 denotes a side wall formed by an insulating film on the transistor formed on the substrate. A reference number 200 denotes the first metal layer used for the source line SL, a power supply line and a common data line I/O, 201 denotes the second metal layer used for the data line DL and others, 202 denotes the third metal layer used for the column selection line YS, 203 denotes an interlayer insulation film, 204 denotes a contact for connecting the N-type diffused layer region 102 and the first metal layer, 205 denotes a contact for connecting the first metal layer and the second metal layer, 206 denotes a contact for connecting the second metal layer and the third metal layer, and 207 denotes a contact for connecting the first metal layer and the gate electrode 104 of the transistor formed on the substrate. Further, a reference number 301 denotes N-type polysilicon to be a source electrode of a vertical transistor PM, 302 denotes intrinsic polysilicon to which impurities to be a channel of the vertical transistor PM are not added, 303 denotes N-type polysilicon to be a drain electrode of the vertical transistor PM, 304 denotes chalcogenide to be a storage element RM, 305 denotes an insulating film, 306 denotes a gate oxide film formed on the side wall of the vertical transistor, 307 denotes a gate electrode of the vertical transistor, that is, the word line WL, 308 denotes an interlayer insulation film formed between the data line DL and the word line WL, and 309 denotes a side wall oxide film. In FIGS. 10 and 11, as in FIG. 9, a node name is shown in parentheses after a layer name on the supposition that the line A–A' is located on the data line DLm and the line B–B' is located on the data line WL1. For example, the arrangement of the gate electrode of transistors QAm, QBm, QCm, QDm can be easily understood by a node name of the gate electrode shown as 104 in FIG. 10.

A so-called cross-point cell formed at each intersection of the word line and the data line can be realized by using the vertical transistor as described above. That is, when the word line and the data line are worked in minimum feature size F, the area of the memory cell is equivalent to four times of the square of F. Therefore, the highly-integrated and large capacity phase change memory can be realized.

When the vertical transistor used in the example is turned off, the intrinsic polysilicon 302 that functions as a channel region is fully depleted and the vertical transistor operates as a so-called fully depleted silicon on insulator (SOI) transistor. Therefore, it is difficult to regulate threshold voltage, compared with the MOS transistor on the substrate. As described in relation to the reading operation shown in FIG. 5, as in the setting of voltage that the potential of the word line in a stand-by state is set so that the potential is lower than the potential of the selected source line, the threshold voltage of the vertical transistor may be also low, another example of the memory array structure is suitable.

The phase change memory provided with memory cells each of which is composed of one storage element made of chalcogenide and one transistor has been mainly described. However, the configuration of the memory cell is not limited to this. A scope in which the invention is applied is not limited to the phase change memory as already described and the invention can be also applied to a memory in which a value of the resistance of a memory cell is different depending upon stored information and stored information is read by detecting current flowing via a data line except the phase change memory. For example, as reading operation at low noise is possible in case the invention is applied to MRAM the magnetoresistive ratio of which is low, a load required for a sense amplifier can be reduced.

SECOND EMBODIMENT

Figure 12:
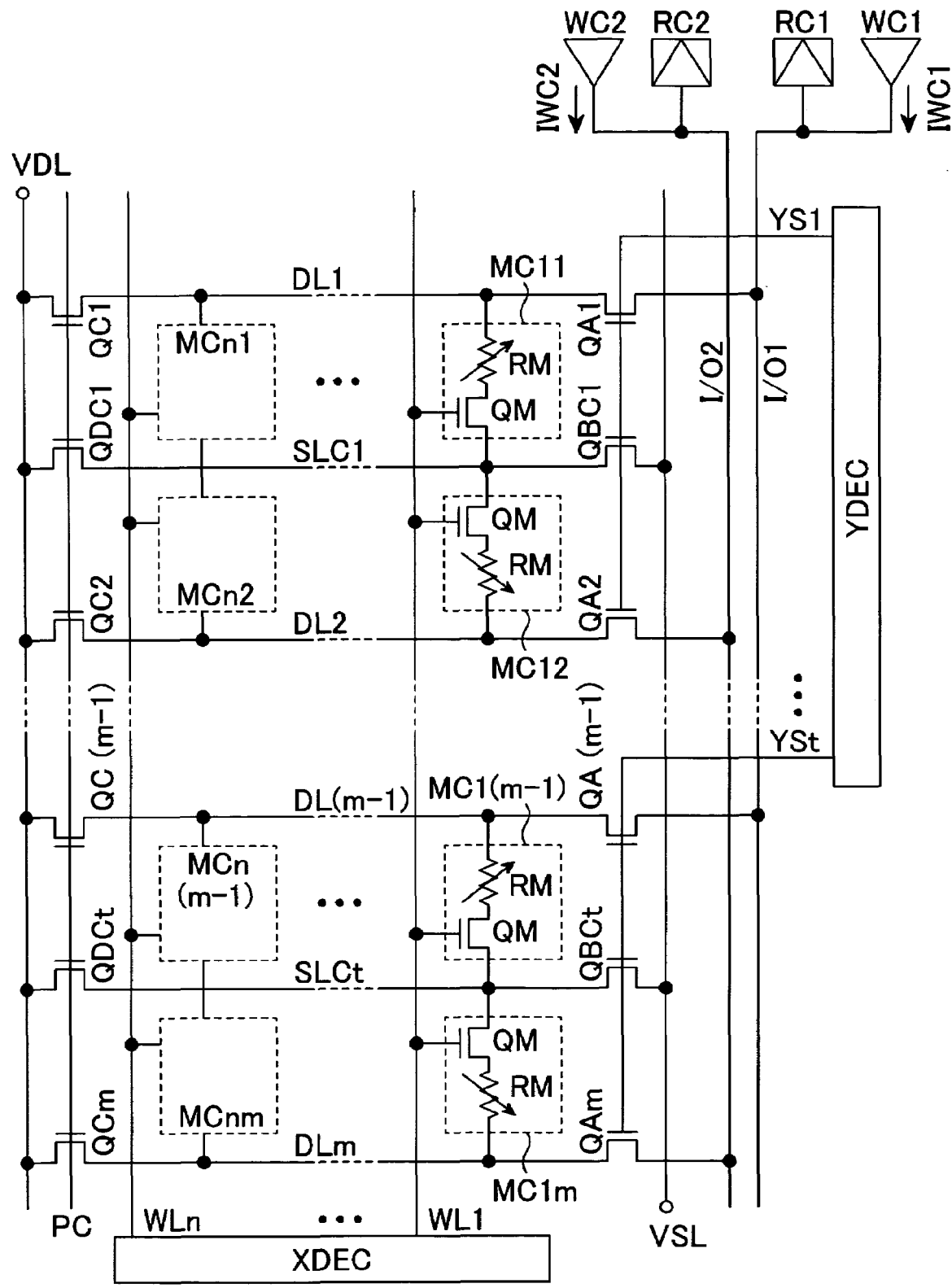
FIG. 12 shows an example of another configuration of a memory array using the memory cell composed of one storage element the resistance of which varies according to stored information and one selection transistor according to the invention.

In this embodiment, another configuration and another operation of the memory array will be described. FIG. 12 shows a memory array equivalent to this embodiment and configuration provided with memory cells of (n×m) bits as shown in FIG. 1 is shown. For elements forming the memory cell, a selection transistor QM and a storage element RM depending upon variable resistance and using chalcogenide are included as in the conventional type shown in FIG. 4. This embodiment is characterized in that though the source line is arranged every data line in FIG. 1, stored information is simultaneously read from plural memory cells by arranging a source line every plural data lines and further, regularly connecting a column selection switch to plural common data lines. In FIG. 12, configuration that a source line is arranged every two data lines and further, two common data lines are arranged is shown for one example. The memory array configuration shown in FIG. 12 will be described, paying attention to points different from FIG. 1 below.

Plural (t pieces in this case) source lines SLCq (q=1, - - - , t) are arranged every two data lines and each source of transistors QM in two memory cells in a direction of a column is connected to the source line SLCq in common. The relation of "m=2t" holds true between the number t of the source lines SLCq and the number m of the data lines DLr (r=1, - - - , m). Plural (t pieces in this case) NMOS transistors QBCq (q=1, - - - , t) are inserted between the source lines SLCq and a source voltage terminal VSL. These transistors are selected by a column decoder YDEC together with column selection switches QA(2q−1), QA(2q) in case two data lines DL(2q−1), DL2q corresponding to the source line SLCq are selected. For example, in case two data lines DL1, DL2 corresponding to the source line SLC1 are selected, a transistor QBC1 is selected together with transistors QA1, QA2. Plural (t pieces in this case) NMOS transistors QDCq (q=1, - - - , t) driven at precharge voltage VDL are arranged on the source line SLCq. Further, for the column selection switches QA(2q−1), QA2q, the data line DL(2q−1) in odd order is connected to a common data line I/O1 and the data line DL(2q) in even order is connected to a common data line I/O2. A reading circuit RC1 and a writing circuit WC1 are connected to the common data line I/O1, and a reading circuit RC2 and a writing circuit WC2 are connected to the common data line I/O2.

The similar reading operation from each of selected two memory cells to that shown in FIG. 5 is enabled by such configuration. That is, voltage difference is applied to only a memory cell connected to a selected pair of data lines and a selected source line by driving the source line corresponding to two data lines to be selected out of plural data lines DL and source lines SLC respectively driven at precharge voltage VDL. Next, a current path is created in only desired two memory cells by selecting a word line and a read-out signal is generated on only two selected data lines. Further, stored information of two bits is simultaneously read by discriminating these read-out signals in the two reading circuits RC1, RC2 via the two common data lines I/O1, I/O2. In the case of writing operation, the similar writing to each of two selected memory cells to that in FIG. 6 is also possible. That is, stored information of two bits is simultaneously written by selecting as in reading operation and generating writing current IWC1, IWC2 on the common data lines I/O1, I/O2 using the two writing circuits WC1, WC2.

The following three effects are acquired by the above-mentioned this embodiment in addition to the effect by the configuration and the operation of the memory array and the memory cell respectively shown in FIG. 1. First, as the number of transistors is reduced because the plural data lines share the source line and the column selection switch, the layout area of the storage device can be reduced.

Secondly, selection that a current path is created in only desired two memory cells by simultaneously selecting the two column selection switches and driving the source line corresponding to the two data lines to be selected is possible. Concretely, as the memory cells of two bits can be simultaneously selected, the memory array suitable for a phase change memory the word structure of which is large and a phase change memory in case prefetch operation is applied and a data transfer rate is enhanced can be realized.

Thirdly, in case the invention is applied to the memory array composed of the memory cells in the phase change memory having the configuration shown in FIG. 9, the effect of reducing the resistance of the source line SLC is acquired. That is, as the pitch of the source line is made 4F by arranging the source line SLC every two data lines, the width of the source line can be extended up to 3F. As the width of the source line in this case is 3/2 times in terms of one memory cell, the resistance of the source line is reduced up to 2/3 in inverse proportion to the width. Therefore, the further high-speed phase change memory can be realized because the time constant of the source line SLC is reduced.

In FIG. 12, the example that the source line is arranged in parallel to the two data lines is shown, however, the number of the data lines is not limited to this and the source line can be arranged every further multiple data lines. In this case, if a common data line, a reading circuit and a writing circuit are provided by the number of simultaneously selected data lines, the invention is suitable to realize a memory having further large word structure and a memory of a high data transfer rate. The invention can be also applied to a memory in which a value of the resistance of a memory cell is different depending upon stored information as in a phase change memory and stored information is read by detecting current flowing via a data line except a phase change memory. For example, the invention can be also applied to MRAM and the similar effect can be acquired.

THIRD EMBODIMENT

In this embodiment, further another configuration and further another operation of the memory array will be described. A memory array equivalent to this embodiment is characterized in that a so-called twin cell in which the memory array configuration shown in FIG. 12 is applied and complementary stored information is held is provided. Memory array configuration and operation in this embodiment will be described, paying attention to this point below.

Figure 13:
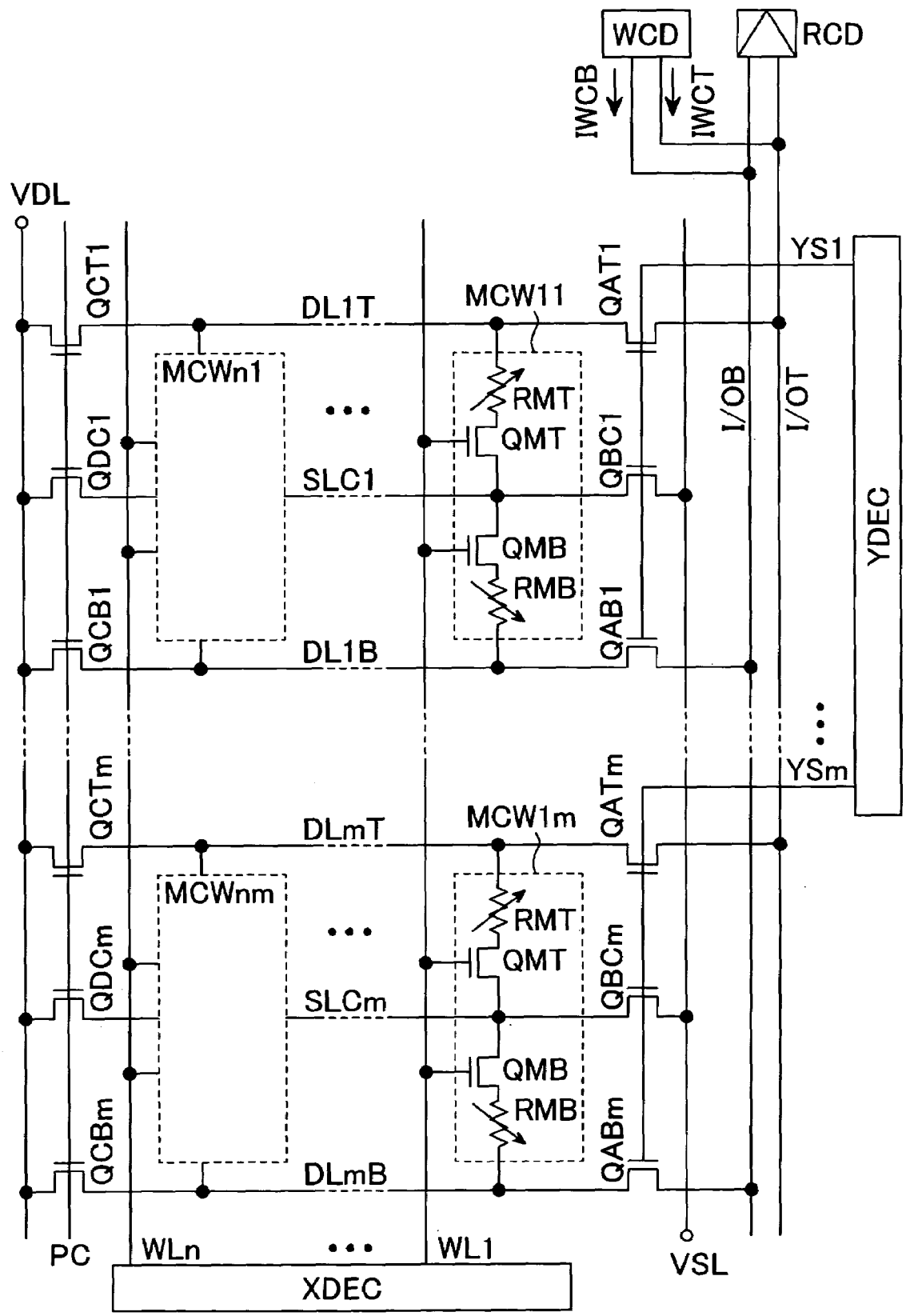
FIG. 13 shows an example of another configuration of a memory array using a memory cell composed of two storage elements the resistance of which varies according to stored information and two selection transistors according to the invention.

FIG. 13 shows configuration provided with twin cells MCWpr (p=1, - - -, n, r=1, - - -, m) of (n×m) bits for one example. The twin cell MCWpr is arranged at each intersection of a word line WLp (p=1, - - -, n) and plural (m pairs in this case) data line pairs. Plural data line pairs are composed of plural true data lines DLrT (r=1, - - -, m) and plural bar data lines DLrB (r=1, - - -, m) in which a signal of reverse polarity to the true data line DLrT is generated. Each of plural (m pieces in this case) source lines SLCr (r=1, - - -, m) is arranged every a pair of data lines.

The twin cell is composed of two selection transistors QMT, QMB and two storage elements RMT, RMB using chalcogenide and depending upon variable resistance. First, a memory cell that holds stored information of one polarity is formed by inserting the storage element RMT and the selection transistor QMT respectively connected in series between the true data line DLT and the source line SLC. Besides, the other memory cell that holds stored information of reverse polarity to one memory cell is formed by inserting the storage element RMB and the selection transistor QMB respectively connected in series between the bar data line DLB and the source line SLC. The twin cell that holds complementary stored information can be realized by such configuration. For the selection transistors QMT and QMB, the planar transistor formed on the substrate and shown in FIG. 8 and the vertical transistor shown in FIG. 10 are applied.

Common data lines I/OT and I/OB correspond to a pair of data lines, and a reading circuit RCD and a writing circuit WCD are arranged. Plural (m pieces in this case) column selection switches QATr (r=1, - - -, m) are inserted between the common data line I/OT and each true data line DLrT and plural (m pieces in this case) column selection switches QABr (r=1, - - -, m) are inserted between the common data line I/OB and each bar data line DLrB. Plural (m pieces in this case) NMOS transistors QCTr and QCBr (r=1, - - -, m) for driving a pair of data lines at precharge voltage VDL are inserted between the pair of data lines and a precharge voltage terminal VDL.

Plural (m pieces in this case) NMOS transistors QBCr (r=1, - - -, m) for driving the source line SLCr at source voltage VSL as in FIG. 12 are arranged between each source line SLCr and a source voltage terminal VSL. Plural (m pieces in this case) NMOS transistors QDCr (r=1, - - -, m) for driving the source line SLC at precharge voltage VDL are arranged between the source line SLCr and the precharge voltage terminal VDL. The column selection switches QATr and QABr out of these transistors correspond to a pair of data lines and are selected together with the corresponding transistor QBCr by a column decoder as in the memory array shown in FIG. 12. In FIG. 13, an example that column selection lines YSr (r=1, - - -, m) corresponding to these gates are directly connected is shown. A precharge enable signal line PC is connected to each gate of the transistors QCTr, QCBr, QBCr in common.

Figure 14:
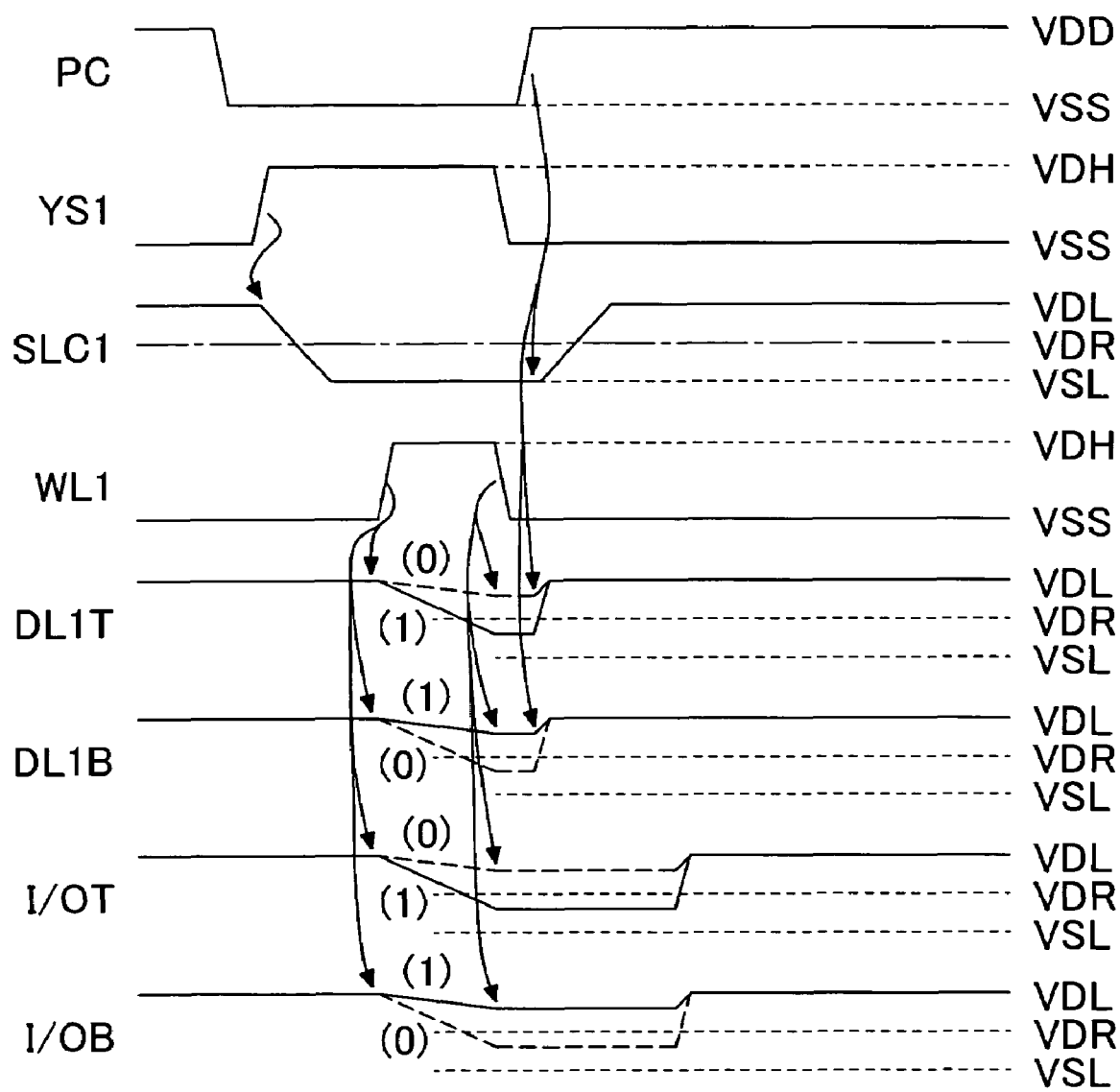
FIG. 14 shows the read-out operation timing of the memory array shown in FIG. 13.

FIG. 14 shows an operational waveform in case a twin cell MCW11 is selected in the reading operation of the memory array equivalent to this embodiment. First, a source line SLCL corresponding to a pair of data lines to be selected out of plural data lines DL and plural source lines SL respectively driven at precharge voltage VDL is driven. Then, voltage difference is applied to only a memory cell connected to the pair of data lines to be selected and the source line. Then, a current path is created in only the desired memory cell MCW11 by selecting a word line WL1 and a complementary read-out signal is generated on only selected data lines DLLT and DLLB. Further, stored information is read by discriminating the complementary read-out signal in the reading circuit RCD via the common data lines I/OT and I/OB. When the voltage of the word line WL1 continues to be increased as described in relation to FIG. 5, one data line driven in a memory cell in a low-resistance state is discharged up to the vicinity of source voltage VSL and signal voltage difference with the other data line driven in a memory cell in a high-resistance state decreases. To prevent such operation, signal voltage difference equivalent to the double of the operation shown in FIG. 5 is generated by lowering the voltage of the word line WL1 at timing before the voltage of the other data line driven in the memory cell in the high-resistance state exceeds reference voltage VDR as shown in FIG. 14.

Figure 15:
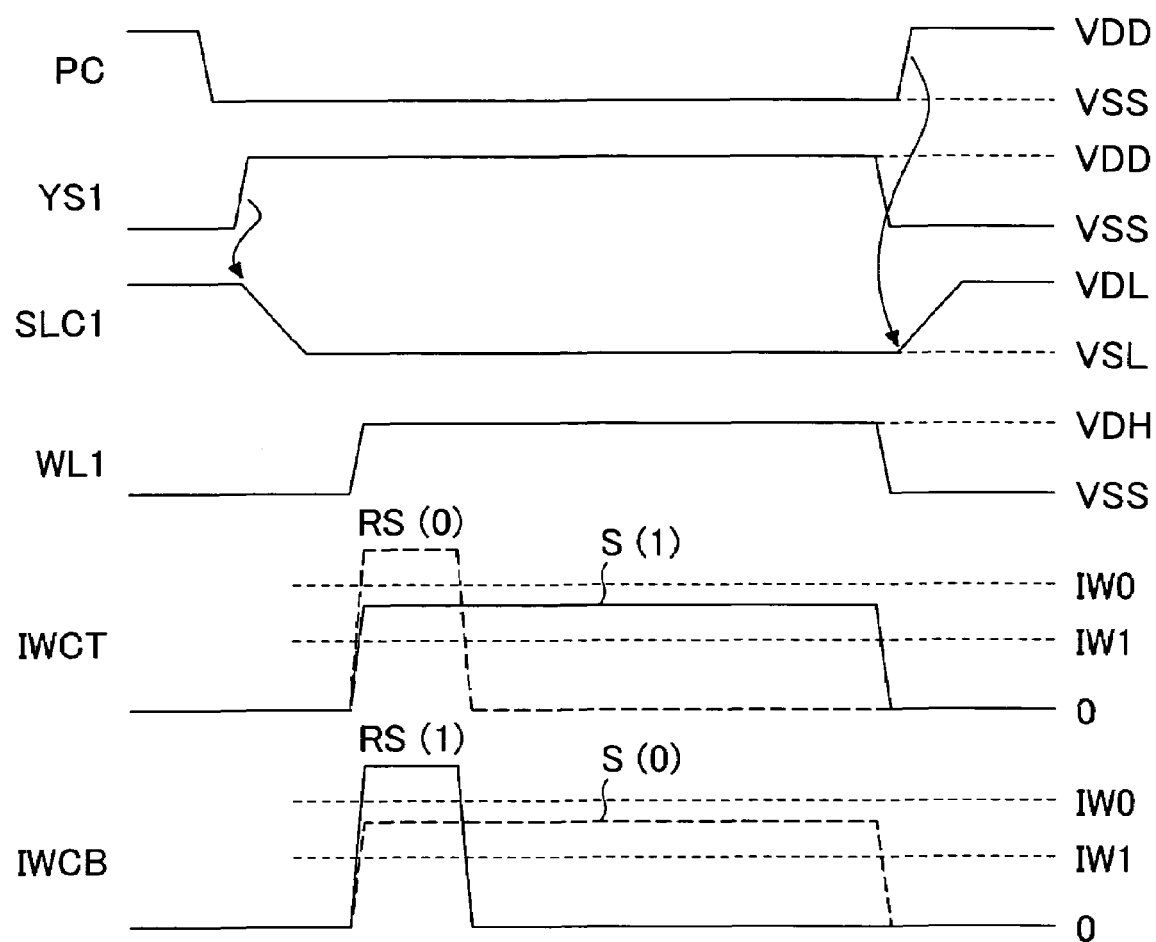
FIG. 15 shows the writing operation timing of the memory array shown in FIG. 13.

FIG. 15 shows an operational waveform in case the twin cell MCW11 is selected in the writing operation of the memory array equivalent to this embodiment. First, the memory cell MCW11 is selected in the similar procedure to the reading operation. Next, when the writing circuit WCD drives the common data lines I/OT and I/OB, writing current IWCT and IWCB is generated. As complementary stored information is written in this case, a set pulse (S(1)) is generated on the common data line I/OT and a reset pulse (RS(1)) is generated on the common data line I/OB in case '1' is written. In case '0' is written, a reset pulse (RS(0)) is generated on the common data line I/OT and a set pulse (S(0)) is generated on the common data line I/OB. Even if either stored information is written, the memory cell is selected by the pulse width of set current.

The following two effects are acquired by the configuration and the operation of the memory array and the memory cell respectively described above. First, the effect of reducing power consumption in the reading operation described in relation to FIG. 1 is also acquired in the memory array composed of twin cells by arranging the column selection switches QATr and QABr in a pair of data lines and arranging the selection transistor QBCr in each of the source lines SLCr parallel to pairs of data lines. To explain further concretely, the twin cell is arranged at each intersection of a pair of data lines and the word line, the transistors QCTr and QCBr for precharge are arranged on a pair of data lines, and the transistor QDCr for precharge is arranged on each source line SLCr. A current path is created in only the cell at the intersection of the selected word line and the selected source line by selecting a pair of column selection switches and at the same time, driving the corresponding source line in such configuration and a complementary read-out signal can be generated on only the selected pair of data lines. Therefore, the charge and the discharge of an unselected pair of data lines are inhibited and the power consumption of the phase change memory according to a twin cell system can be reduced.

Secondly, as the memory cell in this embodiment has twin cell structure in which complementary stored information is held, no special reference signal is required to discriminate stored information and a large number of read-out signals can be generated. That is, as a read-out signal having reverse polarity to stored information out of a complementary read-out signal generated on a pair of data lines can be used for discriminating stored information as reference voltage, no reference signal generating circuit is required and circuit design is facilitated. As read-out signals equivalent to the double of the case of the memory cell shown in FIG. 1 are acquired, high-speed reading operation is enabled. Therefore, the phase change memory the reading operation of which is fast can be realized.

A scope in which this embodiment is applied is not limited to the phase change memory and the invention can be also applied to a memory in which a value of the resistance of a memory cell is different depending upon stored information and stored information is read by detecting current flowing via a data line except the phase change memory. For example, as read-out signals equivalent to the double of the conventional type can be also generated in case the invention is applied to MRAM the magnetoresistive ratio of which is low, MRAM the reading operation of which is stable can be realized.

FOURTH EMBODIMENT

Figure 16:
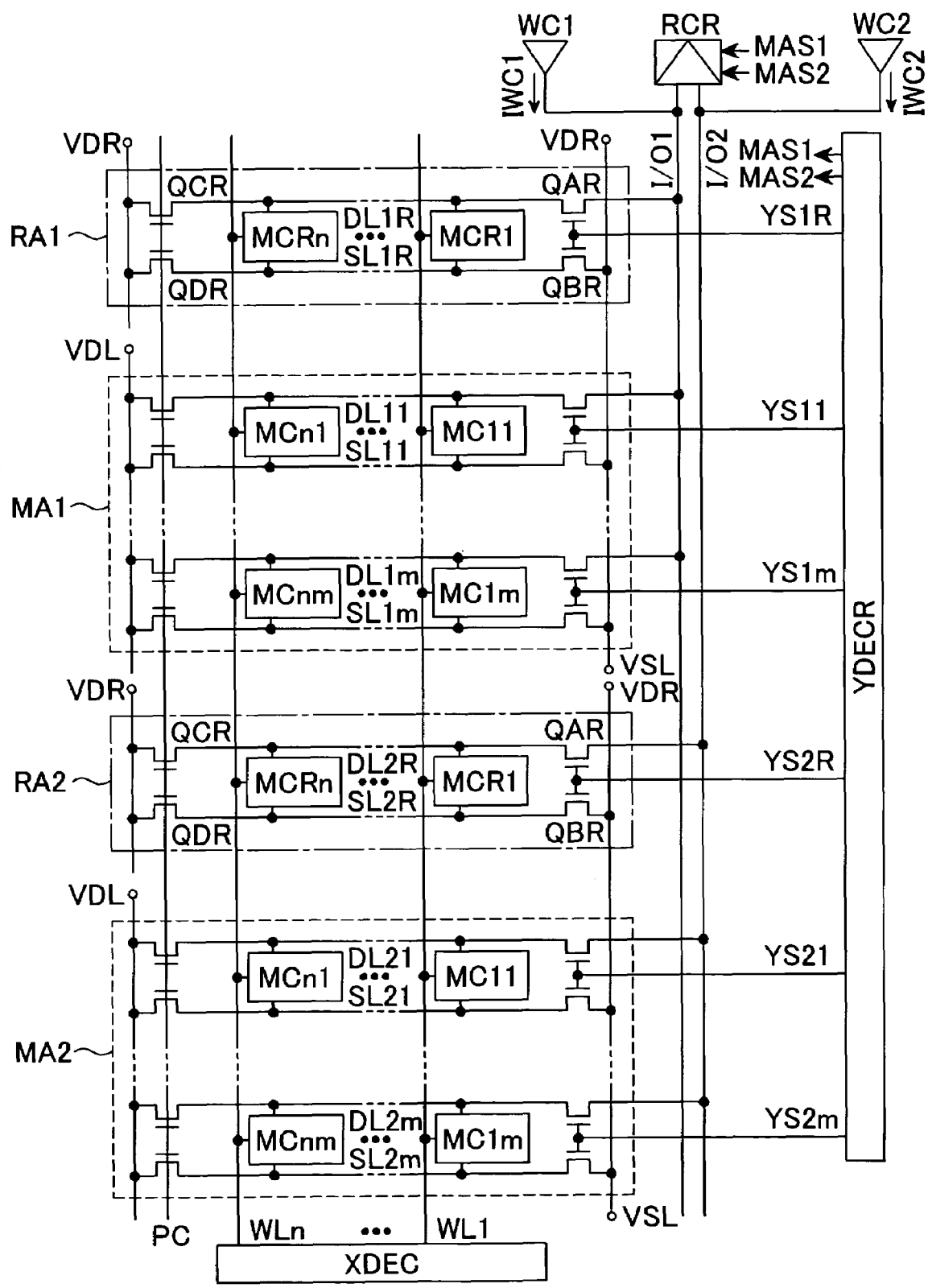
FIG. 16 shows an example of another configuration of a memory array using the memory cell composed of one storage element the resistance of which varies according to stored information and one selection transistor according to the invention.

In this embodiment, configuration in which a reference array is arranged will be described. The object of this embodiment is to provide means for generating a reference signal required for the reading operation of the memory array shown in FIG. 1. Referring to FIG. 16, configuration in which the reference array is arranged every memory array will be described for one example of the reference signal generating means below.

Memory arrays MA1, MA2 are provided with memory cells of (n×m) bits as in FIG. 1. A memory cell MC is shown by a block number for simplification, however, concretely, as in the conventional type shown in FIG. 4, the memory cell is composed of a selection transistor QM and a storage element RM using chalcogenide and depending upon variable resistance. A data line DL1r (r=1, - - - , m) in the memory array MA1 is connected to a common data line I/O1 via an NMOS transistor and similarly, a data line DL2r (r=1, - - - , m) in the memory array MA2 is connected to a common data line I/O2.

In reference arrays RA1, RA2, a reference cell MCRP is arranged at each intersection of a word line WLp (p=1, - - - , n) and each reference data line DL1R, DL2R. The reference cell is also shown by a block number for simplification and concretely, the reference cell is composed of the same selection transistor QM and the same storage element RM using chalcogenide and depending upon variable resistance as the memory cell MC. The source of the selection transistor QM is connected to each source line SL1R, SL2R arranged in parallel with each reference data line DL1R, DL2R as in the case of the memory arrays MA1, MA2. NMOS transistors QAR, QBR to the gate of which a column selection line YSLR is connected in common and NMOS transistors QCR, QDR for precharge are arranged on the reference data line DL1R and on the source line SL1R. Similarly, NMOS transistors QAR, QBR to the gate of which a column selection line YS2R is connected in common and NMOS transistors for precharge QCR, QDR are arranged on the reference data line DL2R and on the source line SL2R. The reference data line DL1R in the reference array RA1 is connected to the common data line I/O1 via the transistor QAR and the reference data line DL2R in the reference array RA2 is connected to the common data line I/O2 via the transistor QAR. Therefore, each reference array RA1, RA2 has the same configuration as a memory array in one row extracted from each memory array MA1, MA2 and each reference array is selected when the column selection lines YSR1, YSR2 are activated by a column decoder YDECR like the data line in the memory array. However, the reference arrays are different in that the column selection transistor QAR is inserted between the common data line I/O1 or I/O2 and the reference data line DL1R or DL2R and reference voltage VDR is input to each transistor QBR, QCR, QDR. The common data lines I/O1, I/O2 are connected to a reading circuit RC and further, memory array selection signals MAS1, MAS2 generated by the column decoder YDECR are input to the reading circuit.

Figure 17:
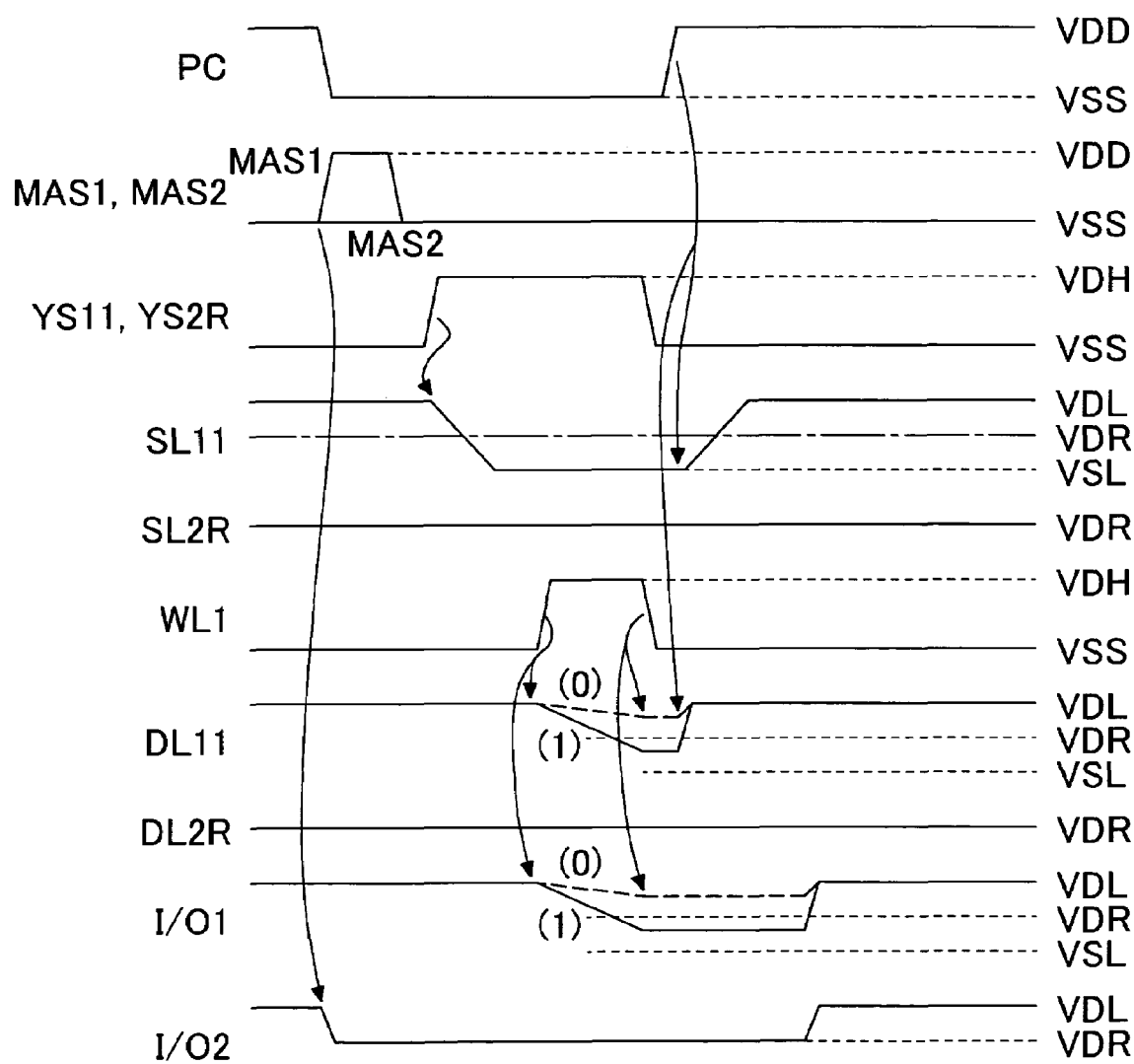
FIG. 17 shows the read-out operation timing of the memory array shown in FIG. 16.

Next, referring to FIG. 17, the reading operation of the memory array using the reference array shown in FIG. 16 will be described. Reading operation in this embodiment is characterized in that the reference array is selected according to the position of the memory array in which a read memory cell is arranged and reference voltage VDR is generated on either of the common data line I/O1 or I/O2. FIG. 17 shows an operational waveform in case the memory cell MC11 in the memory array MA1 is selected for one example.

First, as a precharge enable signal line PC is held at power supply voltage VDD (for example, 1.5 V) in a stand-by state, the data lines DL1r, DL2r and the source lines SL1r, SL2r in the memory arrays MA1, MA2 are held at precharge voltage VDL, and the reference data line DLR and the source line SLR in the reference arrays RA1, RA2 are held at reference voltage VDR by the NMOS transistors QCR and QDR. The common data lines I/O1 and I/O2 are precharged at precharge voltage VDL by the reading circuit RC.

Next, when reading operation is started, a memory array selection signal MAS1 kept at ground potential VSS is driven at power supply voltage VDD and the common data line I/O2 kept at precharge voltage VDL is driven at reference voltage VDR. Next, after the memory array selection signal MAS1 driven at power supply voltage VDD is driven at ground potential VSS, operation for selecting the memory array MA1 is executed. As the memory array MA1 has the same configuration as that shown in FIG. 1, the common data line I/O1 is discharged up to source voltage VSL at speed according to stored information as in FIG. 5 when the column selection line YS11 is activated. In the meantime, in the reference array RA2, when the precharge enable signal line PC kept at power supply voltage VDD is driven at ground potential VSS and the column selection line YS2R kept at ground potential VSS is driven at step-up potential VDH (for example, 1.5 V or more), the transistors QAR, QBR conduct. At this time, as the source line SL2R is succeedingly connected to a reference voltage source VDR, the reference data line DL2R and the common data line I/O2 are held at reference voltage VDR. Therefore, the reading circuit RC discriminates a positive or negative signal generated on the common data line I/O1 based upon reference voltage VDR generated on the common data line I/O2 and reads stored information. When the above-mentioned reading operation is finished, the common data lines I/O1, I/O2 are driven at precharge potential VDL by the reading circuit RC and return to a stand-by state. FIG. 17 shows operation for reading stored information in the memory array MA1, however, in case a memory cell in the memory array MA2 is selected, the similar operation is also executed. That is, when a memory array selection signal MAS2 is activated, the common data line I/O1 kept at precharge voltage VDL is driven at reference voltage VDR. Next, stored information is read by executing operation for selecting the memory array MA2 and the reference array RA1 and driving the common data line I/O2 at potential according to the stored information.

The following two effects are acquired by the configuration and the operation of the memory array and the memory cell respectively described above. First, word-line drive noise can be set off by arranging a reference cell MCRp having the same configuration as the memory cell MC every word line. Generally, as a storage device differentiates minute signal voltage of a few hundred mV generated on a data line though the storage device drives a word line by a pulse having power supply voltage or more, it has a problem of noise connected from the word line to the data line via capacity at an intersection of these. As noise of the same phase is superimposed on a reading data line and a reference data line using this embodiment, the noise can be set off. Therefore, a signal margin can be secured and stable reading operation is enabled.

Secondly, parasitic capacity on the common data line can be balanced because the memory array MA and the reference array RA share the common data line I/O. That is, as the diffusion capacitance of the transistors is equalized by equalizing the number of the NMOS transistors QAr and QAR for the column selection switch connected to the common data line I/O, noise can be inhibited and further stable reading operation is enabled.

In case a signal margin is large and the effect of noise by unbalance between the common data lines in capacity is small, the memory array and the reference array are not required to share the common data line. In this case, as the potential of the common data line is not required to be reset according to a position of the selected memory array and operation for selection can be executed immediately after precharge is stopped, reading time can be reduced. A scope in which this embodiment is applied is not limited to the phase change memory and the invention can be also applied to a memory in which a value of the resistance of a memory cell is different depending upon stored information and stored information is read by detecting current flowing via a data line except the phase change memory. For example, in case the invention is applied to MRAM the magnetoresistive ratio of which is low, word-line drive noise can be also set off, noise generated by unbalance between the common word lines in capacity can be inhibited, and as a signal margin increases, MRAM the reading operation of which is stable can be realized.

The various embodiments have been described based upon the array configuration in which the memory cell MC having the configuration that the storage element RM and the selection transistor QM are connected in series as shown in FIG. 1 is inserted between the data line DL and the source line SL. However, in this memory cell configuration, in case the magnetoresistive ratio of the storage element is large, a degree of the connection of parasitic capacity on the data line and inside an unselected memory cell seems different depending upon stored information. For example, considering a case in which a value of the resistance of the unselected memory cells MC21 to MCn1 when the memory cell MC11 is selected is large and a case in which a value of the resistance is small, the connection in the latter seems strong and the capacity of the data line increases. Therefore, in the latter case, reading is fast. To avoid such a problem, it is desirable that the order of the connection of the element is changed and the selection transistor QM and the storage element RM are connected in series in the memory cell in the order of the selection transistor and the storage element. As in this configuration, parasitic capacity in the unselected memory cell is disconnected from the data line by the selection transistor, the capacity of the data line is inhibited up to a fixed value and the deterioration of reading velocity can be prevented. In the memory array using such memory cell configuration, the similar effect to the effect in the above-mentioned embodiments is also acquired by the invention.

In the memory array configuration according to the invention, effect that the increase of stand-by current can be avoided even if the selection transistor having low threshold voltage is used in the memory cell is also acquired in common in the above-mentioned various embodiments. This reason is that as the potential of the data line DL and the source line SL is held at common precharge potential VD1 in a stand-by state, no current flow in the memory cell even if the threshold voltage of the selection transistor has any value. Conductance increases by lowering the threshold voltage of the selection transistor. Thereby, reading current increases, and a phase change memory and MRAM the operating speed of which is fast can be realized. The effective magnetoresistive ratio determined by the series resistance of the storage element and the selection transistor increases and SN ratio is enhanced. Therefore, a phase change memory and MRAM in which high-speed operation having high SN ratio and the inhibition of power consumption in a stand-by state are compatible can be realized. As described in relation to the reading operation shown in FIG. 5, the threshold voltage of the selection transistor can be further lowered up to a value at which current flowing in the memory cell on the unselected word line has no effect upon operation by setting the stand-by voltage of the word line to a value lower than source voltage VSL. Thereby, more accelerating and the enhancement of SN ratio can be realized.

INDUSTRIAL APPLICABILITY

The invention can be suitably applied to a storage circuit, particularly to a phase change memory and a magnetoresistive random access memory (MRAM).

The invention claimed is:

1. A storage device, comprising:
   plural word lines;
   plural data lines that cross the plural word lines;
   plural control lines that cross the plural word lines and are provided so that each is paired with a corresponding one of the plural data lines;
   plural memory cells arranged at each intersection of the plural word lines and the plural data lines and including a storage element the resistance of which varies according to stored information and a first transistor;
   a precharge circuit for precharging the plural data lines and the plural control lines at first potential;
   a common data line;
   a first switching circuit for selecting one of the plural data lines and connecting it to the common data line; and
   a second switching circuit for selecting one of the plural control lines corresponding to a selected data line out of the plural data lines and driving it at second potential, such that one of the plural memory cells that exists at an intersection of a selected word line out of the plural word lines, a selected data line out of the plural data lines and a selected control line out of the plural control lines is selected thereby, wherein
   the storage element included in each of the plural memory cells is coupled between a corresponding one of the plural data lines and a corresponding one of the plural control lines.

2. A storage device according to claim 1, wherein:
   when the storage device stands by, the precharge circuit precharges the plural data lines and the plural control lines at the first potential; and
   when the storage device reads, the precharge circuit stops precharge, the first switching circuit selects one of the plural data lines and connects it to the common data line, and the second switching circuit makes a potential difference between the selected data line and the selected control line by selecting one of the plural control lines paired with the selected data line and connecting it to the second potential.

3. A storage device according to claim 1, wherein:
   the precharge circuit includes plural first transistors arranged between a first power supply line for supplying the first potential and the plural data lines and plural second transistors arranged between the first power supply line and the plural control lines;
   the first switching circuit includes plural third transistors arranged between the common data line and the plural data lines;
   the second switching circuit includes plural fourth transistors arranged between a second power supply line for supply the second potential and the plural control lines;
   while the storage device stands by, the plural data lines and the plural control lines are precharged at the first potential when the plural first transistors and the plural second transistors conduct; and
   when the storage device reads, the plural first transistors and the plural second transistors are turned off, one of the plural third transistors selects one of the plural data lines and connects it to the common data line, and the fourth transistor makes potential difference between the selected data line and the selected control line by selecting one of the plural control lines paired with the selected data line and connecting it to the second power supply line.

4. A storage device according to claim 2, wherein:
   the potential of the plural word lines when the storage device stands by is lower than the first potential.

5. A storage device according to claim 4, wherein:
   the threshold voltage of the first transistor is lower than the threshold voltage of the plural second transistors forming a control circuit of the storage device.

6. A storage device according to claim 1, further comprising:
   a reading circuit connected to the common data line.

7. A storage device according to claim 1, wherein:
   the first transistor of the memory cell is a MOS transistor and the source of the MOS transistor is connected to one of the corresponding plural control lines; and
   the storage element of the memory cell is a resistive element having two nodes, one node is connected to one of the corresponding plural data lines and the other node is connected to the drain of the MOS transistor.

8. A storage device according to claim 1, wherein:
   the first transistor of the memory cell is a MOS transistor and the drain of the MOS transistor is connected to one of the corresponding plural data lines; and
   the storage element of the memory cell is a resistive element having two nodes, one node is connected to one of the corresponding plural control lines and the other node is connected to the source of the MOS transistor.

9. A storage device according to claim 7, wherein:
   the MOS transistor has structure that a current path between the source and the drain is diagonally formed for one of the corresponding plural data lines.

10. A storage device according to claim 7, wherein:
    a MOS transistor forming the selection transistor has structure that a current path between the source and the drain is formed in a direction perpendicular to the surface of a semiconductor substrate.

11. A storage device according to claim 7, wherein:
    a crystal state of a resistive element forming the storage element changes when Joule heat is applied and a value of the resistance changes according to the crystal state.

12. A storage device according to claim 1, wherein:
    the storage element includes chalcogenide.

* * * * *